US 8,772,875 B2

(12) United States Patent
Mohamed et al.

(10) Patent No.: US 8,772,875 B2
(45) Date of Patent: *Jul. 8, 2014

(54) SEMICONDUCTOR ON GLASS SUBSTRATE WITH STIFFENING LAYER

(71) Applicant: Corning Incorporated, Corning, NY (US)

(72) Inventors: Nadia Ben Mohamed, Echirolles (FR); Ta-ko Chuang, Painted Post, NY (US); Jeffrey Scott Cites, Horseheads, NY (US); Daniel Delprat, Crolles (FR); Alexander Usenko, Painted Post, NY (US)

(73) Assignees: Corning Incorporated, Corning, NY (US); SOITEC, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 13/973,562

(22) Filed: Aug. 22, 2013

(65) Prior Publication Data
US 2013/0341756 A1 Dec. 26, 2013

Related U.S. Application Data

(62) Division of application No. 13/714,792, filed on Dec. 14, 2012, now Pat. No. 8,518,799, which is a division of application No. 12/827,582, filed on Jun. 30, 2010, now Pat. No. 8,357,974.

(51) Int. Cl.
*H01L 29/786* (2006.01)

(52) U.S. Cl.
USPC ..... 257/347; 257/507; 257/350; 257/E27.111

(58) Field of Classification Search
USPC .......... 257/347, 507; 438/431, 455–458, 528
See application file for complete search history.

(56) References Cited

U.S. PATENT DOCUMENTS

| 5,374,564 | A | 12/1994 | Bruel | 437/24 |
| 6,599,814 | B1 | 7/2003 | Vanhaelemeersch et al. | 438/431 |
| 7,176,528 | B2 | 2/2007 | Couillard et al. | 257/347 |
| 7,446,010 | B2 | 11/2008 | Li et al. | 438/328 |
| 7,456,057 | B2 | 11/2008 | Gadkaree et al. | 438/179 |
| 8,357,974 | B2 * | 1/2013 | Mohamed et al. | 257/347 |
| 2004/0224482 | A1 | 11/2004 | Kub et al. | 438/458 |
| 2006/0038228 | A1 | 2/2006 | Aitken et al. | 257/347 |
| 2008/0308897 | A1 | 12/2008 | Kakehata et al. | 257/507 |
| 2009/0032873 | A1 | 2/2009 | Cites et al. | 257/347 |
| 2009/0133811 | A1 | 5/2009 | Moriceau et al. | 156/151 |
| 2010/0127343 | A1 | 5/2010 | Daigler et al. | 257/507 |

OTHER PUBLICATIONS

C. Mazuré et al., "Advanced Electronic Substrates for the Nanotechnology Era," The Electrochemical Society *Interface*, Winter 2006, pp. 33-40.

(Continued)

*Primary Examiner* — Dung A. Le
(74) *Attorney, Agent, or Firm* — Ryan T. Hardee

(57) ABSTRACT

A semiconductor-on-glass substrate having a relatively stiff (e.g. relatively high Young's modulus of 125 or higher) stiffening layer or layers placed between the silicon film and the glass in order to eliminate the canyons and pin holes that otherwise form in the surface of the transferred silicon film during the ion implantation thin film transfer process. The new stiffening layer may be formed of a material, such as silicon nitride, that also serves as an efficient barrier against penetration of sodium and other harmful impurities from the glass substrate into the silicon film.

19 Claims, 8 Drawing Sheets

(56) References Cited

OTHER PUBLICATIONS

R.W. Bower, et al., "Low temperature $Si_3N_4$ direct bonding," *Appl. Phys. Lett.*, vol. 62, No. 26, Jun. 28, 1993, pp. 3485-3487.

G.K. Celler, et al., "Frontiers of silicon-on-insulator," Applied Physics Reviews—Focused Review, *Journal of Applied Physics*, vol. 93, No. 9, May 1, 2003, pp. 4955-4978.

"CVD in Electronic Applications: Conductors, Insulators, and Diffusion Barriers", *Handbook of Chemical Vapor Deposition*, pp. 367-383.

*Handbook of Silicon Wafer Cleaning Technology*, Second Edition, 2008, Published by William Andrew Inc.

D.M. Hansen, et al., "Chemical role of oxygen plasma in wafer bonding using borosilicate glasses," *Applied Physics Letters*, vol. 79, No. 21, Nov. 19, 2001, pp. 3413-3415.

D.M. Hansen, et al., "Plasma Induced Chemical Changes at Silica Surfaces During Pre-Bonding Treatments," *Mat. Res. Soc. Symp. Proc.*, vol. 681E, 2001 Materials Research Society, pp. 12.2.1-12.2.6.

J.R. Davis, *Instabilities in MOD Devices*, Electrocomponent Science Monographs, vol. 1, Gordon and Breach Science Publishers.

R. Klockenkämper, et al., "Depth profiling of a Co-implanted silicon wafer by total-reflection X-ray fluorescence analysis after repeated oxidation and HF-etching," *Anal. Commun.*, 1999, vol. 36, pp. 27-29.

C.R.M. Grovenor, "Graduate Student Series in Materials Science and Engineering Microelectronic Materials," p. 306.

D. Pasquariello, et al., "Surface energy as a function of self-bias voltage in oxygen plasma wafer bonding," Sensor and Actuators, vol. 82, 2000, pp. 239-244.

S.M. Sze, et al., Physics of Semiconductor Devices, Third Edition, Chapter 4, Metal-Insulator-Semiconductor Capacitors, p. 224.

M. Alexe, et al., Wafer Bonding Applications and Technology, Sprinter-Verlag Berlin Heidelberg, 2004.

* cited by examiner

SEMICONDUCTOR ON GLASS SUBSTRATE WITH STIFFENING LAYER

CROSS REFERENCE TO RELATED APPLICATIONS

This application is a continuation application of and is co-pending with and claims the priority benefit of U.S. patent application Ser. No. 13/714,792, filed on Dec. 14, 2012 which is a divisional application of U.S. patent application Ser. No. 12/827,582 filed on Jun. 30, 2010, now U.S. Pat. No. 8,357,974, the content of each are relied upon and incorporated herein by reference in their entirety.

FIELD

The disclosure relates generally to semiconductor-on-glass (SOG) substrates, more particularly, SOG substrates having a stiffening layer between the glass and the semiconductor, and a process of making the same.

BACKGROUND

To date, the semiconductor material most commonly used in semiconductor-on-insulator structures has been single crystalline silicon. Such structures have been referred to in the literature as silicon-on-insulator structures and the abbreviation "SOI" has been applied to such structures. Silicon-on-insulator technology is becoming increasingly important for high performance thin film transistors, solar cells, and displays. Silicon-on-insulator wafers consist of a thin layer of substantially single crystal silicon 0.01-1 microns in thickness on an insulating material. As used herein, SOI shall be construed more broadly to include thin layer material and insulating semiconductor materials other than and including silicon.

Various ways of obtaining SOI structures include epitaxial growth of silicon on lattice matched substrates. An alternative process includes the bonding of a single crystal silicon wafer to another silicon wafer on which an oxide layer of $SiO_2$ has been grown, followed by polishing or etching of the top wafer down to, for example, a 0.05 to 0.3 micron layer of single crystal silicon. Further methods include ion-implantation methods in which hydrogen ions are implanted into a donor silicon wafer to create a weakened layer in the wafer for separation (exfoliation) of a thin silicon layer that is bonded to another silicon wafer with an insulating (or barrier) oxide layer in between. The latter method involving hydrogen ion implantation is currently considered advantageous over the former methods.

U.S. Pat. No. 5,374,564 discloses a "Smart Cut" hydrogen ion implantation thin film transfer and thermal bonding process for producing SOI substrates. Thin film exfoliation and transfer by the hydrogen ion implantation method typically consists of the following steps. A thermal oxide film is grown on a single crystal silicon wafer (the donor wafer). The thermal oxide film becomes a buried insulator or barrier layer between the insulator/support wafer and the single crystal film layer in the resulting of SOI structure. Hydrogen ions are then implanted into the donor wafer to generate subsurface flaws. Helium ions may also be co-implanted with the Hydrogen ions. The implantation energy determines the depth at which the flaws are generated and the dosage determines flaw density at this depth. The donor wafer is then placed into contact with another silicon support wafer (the insulating support, receiver or handle substrate or wafer) at room temperature to form a tentative bond between the donor wafer and the support wafer. The wafers are then heat-treated to about 600° C. to cause growth of the subsurface flaws resulting in separation of a thin layer or film of silicon from the donor wafer. The assembly is then heated to a temperature above 1000° C. to fully bond the silicon to the support wafer. This process forms an SOI structure with a thin film of silicon bonded to a silicon support wafer with an oxide insulator or barrier layer in between the film of silicon and the support wafer.

As described in U.S. Pat. No. 7,176,528, the ion implantation thin film separation technique has been applied more recently to SOI structures wherein the support substrate is a glass or glass-ceramic sheet rather than another silicon wafer. This kind of structure is further referred to as silicon-on-glass (SiOG), although semiconductor materials other than silicon may be employed to form a semiconductor-on-glass (SOG) structure. One potential issue with SiOG is that the glass support or handle substrate contains metal and other constituents that may be harmful to the silicon or other semiconductor layer. Therefore, a barrier layer may be required between the glass substrate and the silicon layer in the SiOG. In some cases, this barrier layer facilitates the bonding of the silicon layer to the glass support substrate by making the bonding surface of the silicon layer hydrophilic. In this regard, an $SiO_2$ layer may be used to obtain hydrophilic surface conditions between the glass support substrate and the silicon layer. A native $SiO_2$ layer may be formed on the donor silicon wafer when it is exposed to the atmosphere prior to bonding. Additionally, the anodic bonding process produces "in situ" $SiO_2$ layer between the silicon donor wafer or exfoliation layer and the glass substrate. If desired, an $SiO_2$ layer may be actively deposited or grown on the donor wafer prior to bonding. Another type of a barrier layer provided by the anodic bonding process disclosed in U.S. Pat. No. 7,176,528 is a modified layer of glass in the glass substrate adjacent to the silicon layer with a reduced level of ions. Anodic bonding substantially removes alkali and alkali earth glass constituents and other positive modifier ions that are harmful for silicon from about 100 nm thick region in the surface of glass adjoining the bond interface.

The anodically created substantially alkali free glass barrier layer and the in situ or deposited $SiO_2$ barrier layers may, however, be insufficient for preventing sodium from moving from the glass substrate into the silicon layer. Sodium readily diffuses and drifts in $SiO_2$ and glasses under the influence of an electric field at slightly elevated temperatures, even at room temperature, possibly resulting in sodium contamination of the silicon layer on the glass substrate. Sodium contamination of the silicon layer may cause the threshold voltages of transistors formed in or on the SiOG substrate to drift, which in turn may cause circuits built on the SiOG substrate to malfunction.

Another potential problem observed with SiOG substrates produced with an ion implantation film transfer process is the occurrence of micro structural defects in the thin silicon layer transferred during exfoliation of the silicon layer (the exfoliation layer) from the donor wafer. FIGS. 1 through 3 show a typical surface morphology of an as transferred silicon exfoliation layer on a glass substrate. FIG. 1 is an atomic force microscope (AFM) image of the surface of a typical as transferred silicon exfoliation layer and FIG. 2 is a plot of the surface topography of this as transferred surface along line 3 in FIG. 1. By as transferred, it is meant that the exfoliation layer has not undergone any surface finishing or processing following exfoliation of the layer from the donor wafer. As can be observed in FIGS. 1 and 2, characteristic features of the as transferred silicon exfoliation layer (or simply as transferred layer) include relatively flat mesas 10 surrounded by canyons 20 that include craters or pin holes 30 that extend deeply into the silicon layer 122. The pin holes 30 may penetrate entirely through the silicon layer 122 to the underlying glass substrate 102. When transistors are made in the silicon layer with the canyons 20 and pin holes 30, the canyons and pin holes are likely to disrupt proper transistor formation and operation. The canyons and pin holes are believed to be a consequence of the ion implantation silicon film transfer process when bonding and transferring the silicon film to a glass support substrate.

There is a need in the art for a process and structure for preventing or at least mitigating the occurrence of canyons and pinholes in the semiconductor layer in SiOG or SOG products fabricated using ion implantation thin film transfer processes.

No admission is made that any reference cited herein constitutes prior art. Applicant expressly reserves the right to challenge the accuracy and pertinence of any cited documents.

SUMMARY

The Applicants have discovered that adding a relatively stiff (relatively high Young's modulus) stiffening layer or layers placed between the silicon exfoliation layer and the glass reduces and even eliminates the canyons and pin holes formed in the surface of the transferred silicon layer during the ion implantation thin film transfer process. The new stiffening layer may also be selected to serve as an efficient barrier against penetration of sodium and other harmful impurities from the glass substrate into the silicon film. Silicon nitride is an example of a suitable stiffening layer material that also serves as an effective barrier layer to sodium and other elements that would potentially contaminate the silicon exfoliation layer.

One embodiment of the disclosure relates to a method of making silicon-on-glass substrates including the following step. Providing a silicon donor wafer. Depositing a stiffening layer having Young modulus exceeding the Young modulus of the glass on a major surface of a single crystal silicon donor wafer. Implanting ions into the major surface of donor wafer through the stiffening layer, such that a buried layer enriched with implanted species is formed in donor wafer defining a thin exfoliation layer of silicon between the buried layer and the major surface of the donor wafer with the stiffening layer thereon. Providing a glass substrate. Transferring the exfoliation layer with the stiffening layer thereon onto the glass substrate, such that the stiffening layer is located between the glass substrate and the exfoliation layer.

An additional embodiment of the disclosure relates to a method of forming a semiconductor on glass structure including the steps of: obtaining a glass substrate having a bonding surface and a semiconductor wafer having a bonding surface; depositing a stiffening layer having a Young's modulus of about 125 GPa or higher, about 150 GPa or higher, about 200 GPa or higher, or about 300 GPa or higher on one of the bonding surface of the glass substrate and the bonding surface of the semiconductor wafer; implanting ions into the bonding surface of the semiconductor wafer to form an exfoliation layer in the bonding surface region of the semiconductor wafer; contacting the bonding surface of the semiconductor wafer with the bonding surface of the glass substrate, with the stiffening layer between the glass substrate and the semiconductor wafer; bonding the exfoliation layer to the glass substrate, with the stiffening layer between the glass substrate and the semiconductor wafer, by heating the semiconductor wafer and glass substrate to an elevated temperature; and separating the exfoliation layer from a remaining portion of the semiconductor wafer, leaving the exfoliation layer bonded to the glass substrate, with the stiffening layer between and, wherein an as separated surface of the exfoliation layer has a surface roughness with a skew level of about 0.6 or lower.

the as separated surface of the exfoliation layer may have a surface roughness with a skewness level of about 0.4 or lower, or about 0.2 or lower.

The as separated surface of the exfoliation layer may have a surface roughness of about 2 nm RMS or less, about 1.5 nm RMS or less, or 1 nm RMS or less.

The stiffening layer may be deposited on the bonding surface of the semiconductor wafer with a thickness of about 100 nm or greater, about 250 nm or greater, or about 350 nm or greater.

The stiffening layer may be deposited on the bonding surface of the glass substrate with a thickness of about 50 nm or greater, about 100 nm or greater, about 250 nm or greater, or about 350 nm or greater.

The stiffening layer may be formed of $Si_3N_4$.

The step of oxidizing the surface of the stiffening layer makes it hydrophilic. The step of oxidizing the surface of the stiffening layer may include forming a $SiO_2$ layer on the stiffening layer having a thickness of about 2 nm to about 150 nm, about 5 nm to about 150 nm, about 2 nm to about 20 nm, about 5 nm to about 10 nm, or about 5 nm.

According to a further embodiment, an oxide layer may be formed on the bonding surface of the semiconductor wafer prior to depositing the stiffening layer on the wafer.

The semiconductor wafer may be formed of substantially single crystal silicon and the oxide layer on the semiconductor wafer is formed or $SiO_2$ and has a thickness within the range from about 1 nm to about 10 nm or less, or from about 2 nm to about 5 nm, of about 20 nm or less, of about 10 nm or less, about 7 nm or less, or about 100 nm or less.

The step of bonding the exfoliation layer to the glass substrate may include applying a voltage potential across the glass substrate and the semiconductor wafer to induce the bond via anodic bonding. The bonding step may further include maintaining the elevated temperature of and the voltage are maintained for a period of time sufficient for positive ions within the oxide glass or oxide glass-ceramic to move within the glass substrate in a direction away from the semiconductor wafer, such that the glass substrate includes (i) a first glass layer adjacent to the exfoliation layer in which substantially no modifier positive ions are present, and (ii) a second glass layer adjacent the first glass layer having an enhanced concentration of modifier positive ions.

According to a further embodiment hereof, a semiconductor on glass structure includes: a semiconductor layer on a glass substrate, with a stiffening layer having a Young's modulus of about 125 GPa or higher, about 150 GPa or higher, about 200 GPa or higher, or about 300 GPa or higher located between the semiconductor layer and a glass substrate and surface roughness with a skewness level of about 0.6 or lower.

An exposed surface of the semiconductor layer may have a surface roughness with a skewness level of about 0.4 or lower, or about 0.2 or lower. The exposed surface of the semiconductor layer may also a surface roughness of about 2 nm RMS or less, about 1.5 nm RMS or less, or 1 nm RMS or less.

The stiffening layer nay have a thickness about 50 nm or greater, 100 nm or greater, about 250 nm or greater, or about 350 nm or greater. The stiffening layer may be formed of $Si_3N_4$. An oxide layer may be located on the stiffening. The oxide layer may be a $SiO_2$ layer on having a thickness of about 2 nm to about 150 nm, about 5 nm to about 150 nm, about 2 nm to about 20 nm, about 5 nm to about 10 nm, or about 5 nm The semiconductor wafer may be formed of substantially single crystal silicon and further comprising a $SiO_2$ layer with a thickness within the range from about 1 nm to about 10 nm or less, or from about 2 nm to about 5 nm, of about 20 nm or less, of about 10 nm or less, about 7 nm or less, or about 100 nm or less between the semiconductor wafer and the stiffening layer.

The glass substrate may includes (i) a first glass layer adjacent to the exfoliation layer in which substantially no modifier positive ions are present, and (ii) a second glass layer adjacent the first glass layer having an enhanced concentration of modifier positive ions.

Additional features and advantages will be set forth in the detailed description which follows, and in part will be readily apparent to those skilled in the art from the description or recognized by practicing the embodiments as described in the written description and claims hereof, as well as the appended drawings. It is to be understood that both the foregoing general description and the following detailed description are merely exemplary, and are intended to provide an overview or framework to understand the nature and character of the claims.

The accompanying drawings are included to provide a further understanding, and are incorporated in and constitute a part of this specification. The drawings illustrate one or more embodiment(s), and together with the description serve to explain principles and operation of the various embodiments. [If there are no appended drawings, amend accordingly.

DETAILED DESCRIPTION

Figure 1:
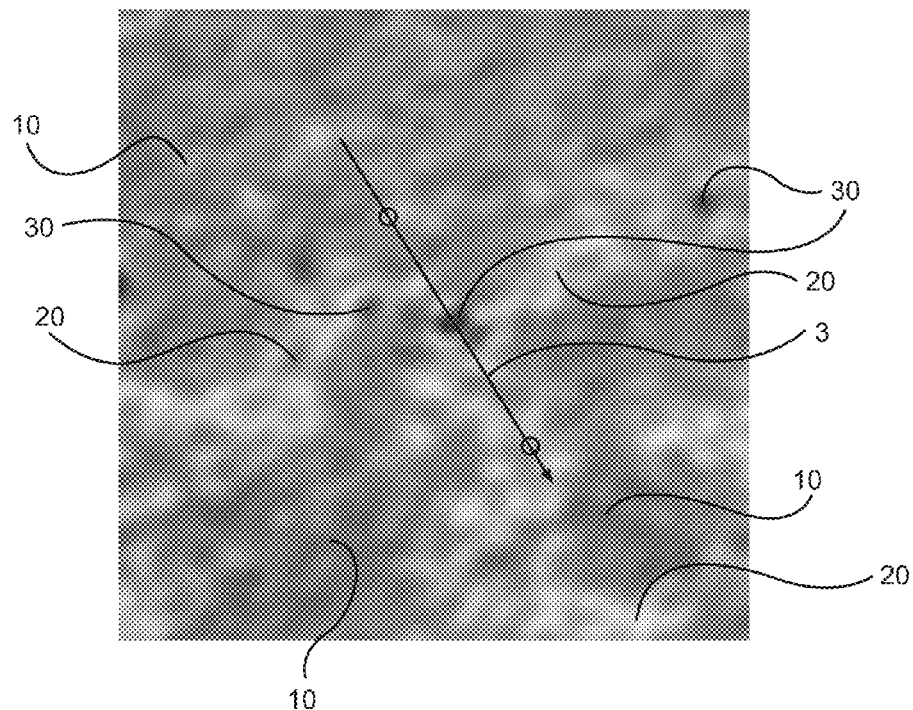
FIG. 1 is an AFM image in plan view of the surface of an as transferred silicon exfoliation layer of an SiOG substrate fabricated using conventional ion implantation thin film transfer processes.

Although the features, aspects and embodiments disclosed herein may be discussed in relation to silicon-on glass (SiOG) structures and the manufacture of SiOG structures, skilled artisans will understand that this disclosure need not be and is not limited to SiOG structures. Indeed, the broadest protectable features and aspects disclosed herein are applicable to any process in which ion implantation thin film transfer techniques are employed to transfer and bond a thin film of a semiconductor material on a glass or glass-ceramic support or handle substrate to produce a semiconductor-on-glass (SOG) structure. For ease of presentation, however, the disclosure herein is primarily made in relation to the manufacture of SiOG structures. The specific references made herein to SiOG structures are to facilitate the explanation of the disclosed embodiments and are not intended to, and should not be interpreted as, limiting the scope of the claims in any way to SiOG substrates. The processes described for the fabrication of SiOG substrates are equally applicable the manufacture of other SOG substrates. The SiOG and SOG abbreviations as used herein should be viewed as referring to semiconductor-on-glass (SOG) structures in general, including, but not limited to, silicon-on-glass (SiOG) structures.

The Applicants have observed that the canyon and pin hole structural defects in the as transferred silicon layer (or exfoliation layer) described above occur more readily and severely in the fabrication of SOG structures with glass support substrates than in the fabrication of SOI structures with semiconductor support substrates. While not intending to be bound by an particularly theory, the Applicants believe that the canyons and pin holes that occur during the fabrication of SiOG substrates are a result of the relatively soft surface of the glass support substrate, as compared to the relatively hard surface of a silicon support substrate, that is in contact with the exfoliation layer during separation of the exfoliation layer. It has been observed that when the defects in the weakened implanted layer grow during separation or exfoliation of the exfoliation layer during fabrication of SOG, the defects have a tendency to form blisters (or bubbles) in the surface of the donor wafer that bulge or press into the relatively soft (relatively low Young's modulus) glass substrate. These blisters may contribute to the formation of canyon and pin hole structural defects in the as transferred silicon exfoliation layer described above.

The Applicants have discovered that adding a relatively hard/stiff (relatively high Young's modulus) stiffening layer or layers between the silicon donor wafer and the glass support substrate prior to bonding and separation reduces and even eliminates the canyons and pin holes in the surface of the as transferred silicon exfoliation layer. The new stiffening layer may also be selected to serve as a barrier against penetration of sodium and other harmful impurities from the glass substrate into silicon film. Silicon nitride ($Si_3N_4$) film is an example of a high young's modulus material suitable for use as stiffening layer that also acts as a barrier layer to alkalis, sodium and other elements found in the glass substrate.

In order to provide some specific context in which to discuss the broadest protectable features and aspects disclosed herein, it will be assumed that the semiconductor-on-substrate structure is an (SOG) structure, such as a semiconductor-on-glass or semiconductor-on-glass-ceramic structure. Such an SOG structure may have suitable uses in connection with fabricating thin film transistors (TFTs), e.g., for display applications, including organic light-emitting diode (OLED) displays and liquid crystal displays (LCDs), integrated circuits, photovoltaic devices, solar cells, thermoelectric devices, sensors, etc. Although not required, the semiconductor material of the exfoliation layer may be in the form of a substantially single-crystal material. The word "substantially" is used in describing the layer to take into account the fact that semiconductor materials normally contain at least some internal or surface defects either inherently or purposely added, such as lattice defects or a few grain boundaries. The word "substantially" also reflects the fact that certain dopants may distort or otherwise affect the crystal structure of the bulk semiconductor.

Ion Implantation Thin Film Transfer:

The subject matter of particular interest herein involves thin film separation via ion implantation into a semiconductor material with a stiffening layer deposited or formed thereon. Thus, in order to provide some additional context, reference is now made to FIGS. 3-6, which illustrate a general ion implantation film transfer process (and resultant intermediate structures) within which the aforementioned stiffening layer may be used in order to manufacture the SOG structure 100 of FIG. 3.

Figure 4:
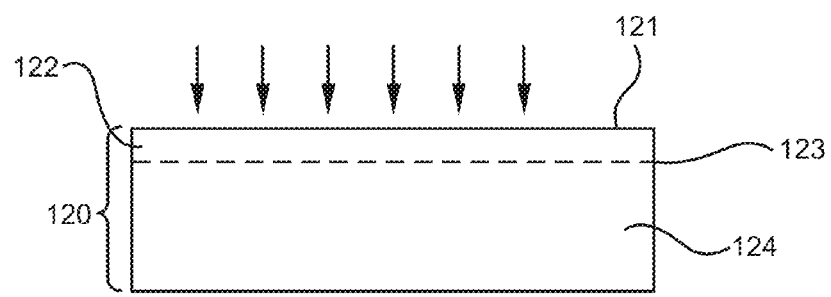
FIG. 4 is a diagrammatic side view of a silicon donor wafer being implanted with ions in conventional ion implantation film transfer processes.

Turning now to FIG. 4, a donor semiconductor wafer 120 is prepared, such as by polishing, cleaning, etc. to produce a relatively flat and uniform implantation surface 121 suitable for bonding to the support or handle substrate 102 (see FIG. 5), e.g., a glass or glass-ceramic substrate. For the purposes of discussion, the semiconductor wafer 120 may be a substantially single crystal Si wafer, although as discussed above any other suitable semiconductor conductor material may be employed. An exfoliation layer 122 is created by subjecting the implantation surface 121 to an ion implantation process (as indicated by the arrows in FIG. 4) to create a weakened region or layer 123 below the implantation surface 121 of the donor semiconductor wafer 120 by implanting H ions and optionally He ions also. Although this ion implantation process is a focus of the disclosure herein, at this point, only general reference will be made to the process for creating the weakened region 123. As is understood in the art, the ion implantation energy and density may be adjusted to achieve a desired thickness of the exfoliation layer 122, such as between about 300-500 nm, although any reasonable thickness may be achieved.

Figure 5:
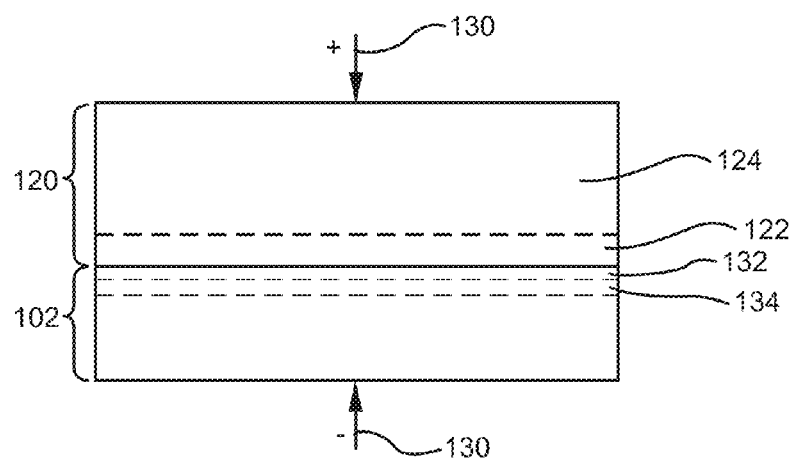
FIG. 5 is a diagrammatic side view of an implanted silicon donor wafer being bonded to a glass support or handle substrate in conventional ion implantation film transfer and anodic bonding processes.

With reference now to FIG. 5, the glass support substrate 102 may be bonded to the exfoliation layer 122 using an anodic bonding process or by a thermal bonding process such as a "Smart Cut" thermal bonding process. A basis for a suitable anodic bonding process may be found in U.S. Pat. No. 7,176,528, the entire disclosure of which is hereby incorporated herein by reference. Portions of this process are discussed below. A basis for a suitable Smart Cut thermal bonding process may be found in U.S. Pat. No. 5,374,564, the entire disclosure of which is hereby incorporated herein by reference.

Appropriate surface cleaning of the glass support substrate 102 (and the exfoliation layer 122 if not done already) is carried out prior to bonding. Thereafter, the implanted donor wafer 120 and the glass support substrate 102 are brought into contact and are pre-bonded. The resulting intermediate structure is thus a stack including the exfoliation layer 122 of the semiconductor donor wafer 120, a remaining portion 124 of the donor wafer 120, and the glass support substrate 102. Prior to or after pre-bonding, the stack of the semiconductor donor wafer 120, the exfoliation layer 122, and the glass substrate 102 is heated (as indicated by the arrows 130 in FIG. 3) to an elevated bonding temperature sufficient to enable ion migration within the stack. The temperature is dependent on the semiconductor material of the donor wafer 120 and the characteristics of the glass substrate 102. By way of example, the temperature of the junction may be taken to within about +/−350° C. of a strain point of the glass substrate 102, more particularly between about −250° C. and 0° C. of the strain point, and/or between about −100° C. and −50° C. of the strain point. Depending on the type of glass, such temperature may be in the range of about 500-600° C. In addition to the above-discussed temperature characteristics, mechanical pressure (as indicated by the arrows 130 in FIG. 3) may be applied to the intermediate assembly. The pressure range may be between about 1 to about 50 psi. Application of higher pressures, e.g., pressures above 100 psi, might cause breakage of the glass substrate 102.

In the case of an anodic bonding process according to one embodiment disclosed herein, a voltage potential (as indicated by the arrows 130 in FIG. 5) is also applied across the intermediate assembly. For example a positive electrode is placed in contact with the semiconductor donor wafer 120 and a negative electrode is placed in contact with the glass substrate 102. The application of a voltage potential across the stack at the elevated bonding temperature induces alkali, alkaline earth ions or alkali metal ions, and pother positive modifier ions in the glass substrate 102 adjacent to the donor wafer 120 to move away from the semiconductor/glass interface further into the glass substrate 102. More particularly, positive ions of the glass substrate 102, including substantially all modifier ions, migrate away from the higher voltage potential of the donor semiconductor wafer 120, forming: (1) a reduced or relatively low positive ion concentration layer 132 (as compared to the original or bulk glass material of the glass substrate 102) in the glass substrate 102 adjacent the exfoliation layer 122; and (2) an enhanced or relatively high positive ion concentration layer 134 (as compared to the original or bulk glass material of the glass substrate 102) in the glass substrate 102 adjacent the reduced positive ion concentration layer. The low/reduced positive ion concentration layer 132 in the glass performs a barrier functionality by preventing positive ion migration from the oxide glass or oxide glass-ceramic into the exfoliation layer 122. The remaining portion 136 of the glass substrate remains as unchanged original bulk material glass or glass ceramic.

Figure 6:
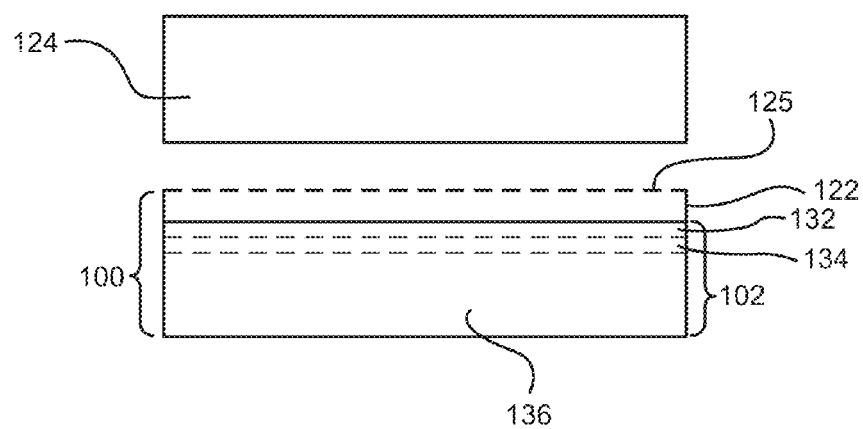
FIG. 6 is a diagrammatic side view of the remaining portion of the donor silicon wafer separated from the exfoliation layer bonded to the glass substrate in conventional ion implantation film transfer processes.

With reference now to FIG. 6, after the intermediate assembly is held under the conditions of temperature, pressure and voltage for a sufficient time, the voltage is removed and the intermediate assembly is allowed to cool to room temperature. At some point during heating, a dwell time, during cooling, and/or after cooling, the exfoliation layer 122 is anodically bonded to the glass substrate and separates (exfoliates or cleaves) from the remaining portion 124 of the donor wafer (not necessarily in that order). The separation of the exfoliation layer 122 from the remaining portion 124 of the donor wafer may be accomplished via spontaneous fracture of the donor wafer 120 along the implanted region 123 due to thermal stresses. Alternatively or in addition, mechanical stresses such as water jet cutting or chemical etching may be used to initiate, facilitate or control the separation process. The remaining portion 124 of the donor wafer 120 is subsequently removed from the exfoliation layer 122, leaving the exfoliation layer bonded to the glass substrate 102. This may include some mechanical peeling if the exfoliation layer 122 has not already become completely free from the remaining portion 124 of the donor wafer 120. The results is an SOG structure or substrate 100, e.g. a glass substrate 102 with the relatively thin exfoliation layer or film 122 of semiconductor material bonded to the glass substrate 102.

Figure 2:
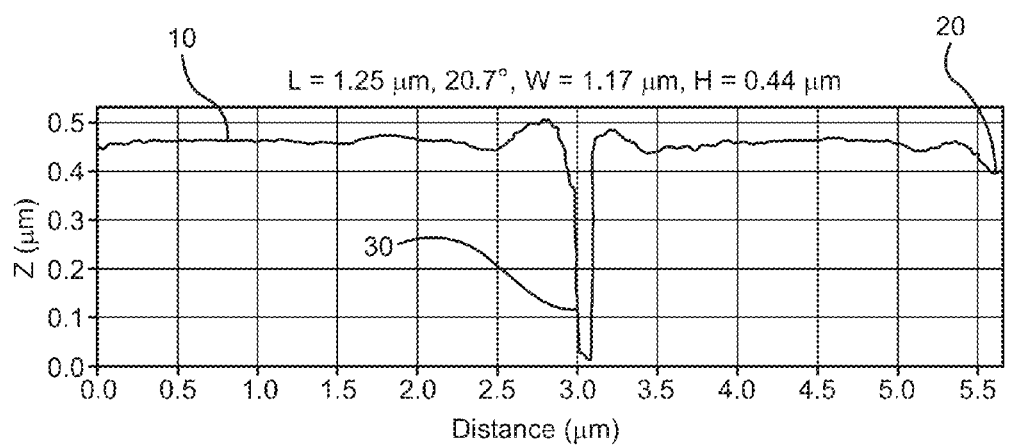
FIG. 2 is a plot of the surface topography of the as transferred exfoliation layer of FIG. 1 taken along line A in FIG. 1.
Figure 3:
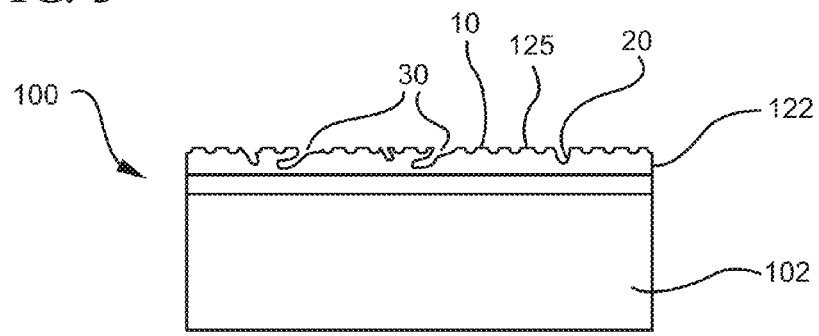
FIG. 3 is a diagrammatic side view of an SiOG substrate fabricated using conventional ion implantation film transfer processes.

As illustrated in FIGS. 1 through 3, the as transferred cleaved or exfoliated surface 125 of the SOI structure 100 may exhibit surface roughness, canyons, pin holes, as well as excessive silicon layer thickness, and/or implantation damage of the silicon layer (e.g., formation of a damaged and/or amorphized silicon layer). Depending on the implantation energy and implantation time, the thickness of the exfoliation layer 122 may be on the order of about 300-500 nm, although other thicknesses may also be suitable. These characteristics may be altered using post bonding processes in order to produce the desired end characteristics of the semiconductor layer 122. For example, a portion or all of the excessive layer thickness, implantation damage and the canyons may be removed by finishing the surface 125 of the as transferred exfoliation layer 122 by polishing, annealing and/or etching the surface of the as transferred exfoliation layer (or "as transferred surface"). However, the canyons and the pinholes in the as transferred surface 125 may be too deep to be removed with such finishing operations. While not intending to be bound by an particularly theory, as described above, the Applicants theorize that the canyons 20 and pin holes 30 in the as transferred surface are a result of improper stiffening of the silicon surface in contact with the relatively soft glass support substrate during bonding and exfoliation. It is noted that the semiconductor donor wafer 120 may be repeatedly refinished via polishing, etching and/or annealing and reused to continue donating many further exfoliation layers to produce many further SOI structures 100.

Stiffening Layer Fabrication:

By way of example only, regular round 300 mm prime grade silicon wafers may be chosen for use as donor wafers or substrates 120' for the fabrication of SiOG structures or substrates. The donor wafers may have <001> crystalline orientation and 8-12 Ohm/cm resistivity, and be Cz grown, p-type, boron doped wafers. Crystal Originated Particle (COP) free wafers may be chosen, because the COPs might obstruct the film transfer process or disturb transistor operation. Doping type and level in the wafers may be chosen to obtain desirable threshold voltages in eventual transistors to be subsequently made on the SiOG substrates. The largest available wafer size 300 mm may be chosen, because this will allow economical SiOG mass production.

According to a further embodiment hereof, 180×230 mm rectangular donor wafers or donor tiles may optionally be cut from the initially round wafers. The donor tile edges may be processed with a grinding tool, lasers, or other known techniques, in order to profile the edges and obtain a round or chamfered profile similar to SEMI standard edge profile. Other required machining steps, such as corner chamfering or rounding and surface polishing, may also be performed. Such donor wafer substrates or tiles may also be used to fabricate rectangular SOG structures in accordance with the other embodiments described herein.

Turning now to FIGS. 7 through 12, according to one embodiment of an SOG substrate with a stiffening layer as described herein, a relatively hard (relatively high Young's modulus) stiffening layer 142 is deposited on a silicon donor wafer 120' prior to placing the donor wafer in contact with the support substrate. By relatively high Young's modulus as used herein and in the appended claims, it is meant a Young's modulus that is about the same or higher than the Young's modulus of the silicon, e.g. a Young's modulus of about 125, GPa or higher, about 150 GPa or higher, about 200 GPa or about 300 GPa or higher. The stiffening layer 142 may be deposited on the bonding surface 121' of the donor wafer 120' using a low pressure chemical vapor deposition (LPCVD), or other suitable deposition process, such as plasma-enhanced chemical vapor deposition (PECVD), with or without stripping of a native oxide film 146 from the donor wafer 120'. Alternatively, the stiffening layer can be deposited on the glass support or receiver substrate using a PECVD process not exceeding strain point temperature of the glass, or with any other well known deposition technique that is compatible with the glass support substrate. Use of a relatively thin glass support substrate, e.g. a glass support substrate with a thickness thinner than about 0.7 mm, or from about 0.3 mm to about 0.5 mm, reduces the occurrence of canyons and pin holes in the exfoliation layer during exfoliation and bonding.

Silicon Nitride, $Si_3N_4$, which has a Young's modulus of about 150 GPA to about 380 GPa, about 210 GPa to 380 GPa, or about 250 GPa, depending on how it is formed, may be deposited on the bonding surface 121' of the donor wafer 120' as the stiffening layer 142. The stiffening layer may be formed on the donor wafer with a thickness of about 100 nm or greater, about 250 nm or greater, or about 350 nm or greater. Alternatively, the stiffening layer may be deposited on the glass support substrate with a thickness of about 50 nm or greater, about 100 nm or greater, about 250 nm or greater, or about 350 nm or greater. Silicon nitride has the added benefit of being a much stronger barrier against movement of sodium, alkali metals, and other elements in the glass support substrate 102' into the silicon exfoliation layer 122' than either an ion depleted glass barrier layer 132' created by anodic bonding or an in situ or deposited $SiO_2$ barrier layer.

As previously described herein, the native oxide film 146 may be intentionally left on the surface of the donor tile prior to deposition of the $Si_3N_4$ stiffening layer. Moreover, the surface of the silicon donor tile may be oxidized using thermal, plasma, or chemical oxidation processes to form or thicken an oxide layer 146 on the donor wafer before deposition of the $Si_3N_4$ stiffening layer. Alternatively, steps may be taken to remove the native oxide film or to prevent or minimize the formation of a native oxide film on the donor tile prior to deposition of the stiffening layer.

Since a $SiO_2$ layer has a relatively low elastic modulus material (Young's modulus of 70), any excessive thickness of the oxide layer may lower the stiffening effect of the relatively hard $Si_3N_4$ stiffening layer (Young's modulus of 150 GPa). If the thickness of the oxide layer is much smaller than the thickness of the silicon exfoliation layer to be transferred, such as 10% of the thickness of the exfoliation layer, then the oxide layer will not detrimentally lower the stiffening effect of the stiffening layer. On the other hand, this oxide layer serves to insulate the Si layer from $Si_3N_4$ electrical charges. Thus, there is a tradeoff between enhanced inhibition of canyons and pin hole formation with a relatively thin oxide layer and reduced influence of the $Si_3N_4$ layer electrical charges on electrical devices formed on the substrate with a relatively thick oxide layer. Up to a 200 nm silicon exfoliation layer is transferred. Therefore, the thickness of the oxide layer should be within the range from about 1 nm to about 10 nm or less, or from about 2 nm to about 5 nm, or it may be about 20 nm or less, about 10 nm or less, or about 7 nm or less, but in some cases may be about 100 nm or less.

Silicon nitride is not, however, a material that is readily bondable to glass. Two smooth surfaces become bondable if both have the same hydrophilicity sign, e.g. if they are either both hydrophilic or both hydrophobic. By virtue of its chemical composition $Si_3N_4$ is hydrophobic, whereas glass surfaces can be easily rendered hydrophilic, but cannot readily be rendered hydrophobic. Therefore, the surface of the $Si_3N_4$ stiffening layer 142 should be treated to make it hydrophilic, thereby making the bonding surface 121' of the donor wafer 120' hydrophilic and readily bondable to the glass support substrate 102'. Alternatively, the surface of the $Si_3N_4$ stiffening layer 142 may be coated with an auxiliary hydrophilic material layer or film 148 in order to make it hydrophilic.

Figure 8:
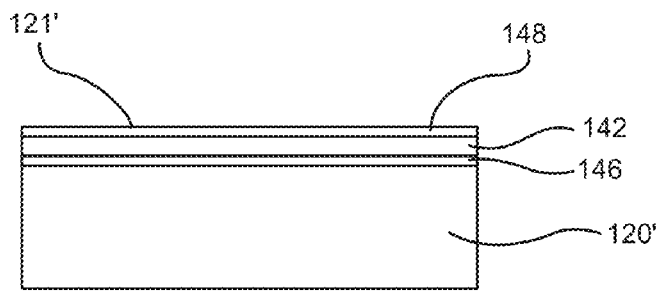
FIG. 8 is a diagrammatic side view of the silicon donor wafer of FIG. 7 with an oxide layer deposited on the stiffening layer of FIG. 7 in accordance with an embodiment of the present invention.

According to one embodiment as illustrated in FIG. 8, especially when the stiffening layer is deposited on the glass support substrate, but also when it is deposited on the donor wafer, an optional thin, about 2 nm to about 150 nm thick, about 5 nm to about 150 nm thick, about 2 nm to about 20 nm thick, about 5 nm to about 10 nm thick, or about 5 nm thick $SiO_2$ oxide bonding layer 148 may be deposited or formed on the $Si_3N_4$ stiffening layer 142. The oxide bonding layer 148 "oxidizes" the surface of the stiffening layer and makes the bonding surface 121' of the donor wafer 120' hydrophilic for bonding of the exfoliation layer 122' to the glass substrate 102'. The bonding layer 148 should be thick enough to absorb water at the interface and thin enough to limit surface roughness after deposition within acceptable ranges for effective bonding. This results in an oxide-nitride-oxide 146-142-148 (ONO) structure on the bonding surface 121' silicon donor wafer 120'. The bottom 146 and top 148 oxides in the ONO structure may be respectively called a pad oxide and cap oxide. The thickness of all three films are carefully chosen to produce the desired canyon and pin hole prevention effect during fabrication of the SiOG structure. Such an ONO structure may be employed in other embodiments described herein. A $Si_3N_4$ oxidation process, such as heating the donor wafer with the stiffening layer deposited thereon in an oxygen rich atmosphere, may be employed to oxidize the surface of the $Si_3N_4$ stiffening layer in order to grow the bonding layer on the stiffening layer and make it hydrophilic. Alternatively, the oxide bonding layer 148 may also be deposited using a LPCVD or PECVD process, or the oxide bonding layer may be created by oxygen plasma conversion of the surface of the stiffening layer as described in more detail hereinafter. Other suitable methods to deposit or produce an oxide bonding layer in or on the surface of the $Si_3N_4$ stiffening layer may be alternatively or additionally employed.

Figure 9:
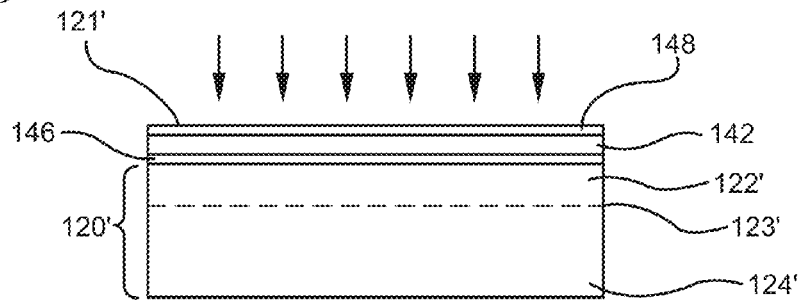
FIG. 9 is a diagrammatic side view of the donor wafer of FIG. 8 being implanted with ions in accordance with an embodiment of the present invention.

As illustrated in FIG. 9, Hydrogen ions (such as $H^+$ and/or $H^{2+}$ ions) are then implanted (as described above with reference to FIG. 4) through the bonding surface 121' of the $Si_3N_4$ stiffening layer 142 and the oxide layers 146 and 148 and into the donor wafer 120' to a depth of about 400 nm below the $SiO_2$ layer on the $Si_3N_4$ layer, in order to form a damage/weakened zone or layer 123' in the silicon donor wafer 120'. Co-implantation of Helium ions with the Hydrogen ions, as is well understood in the art, may also be employed to form the weakened region 123'. An exfoliation layer 122' (with the oxide layers 146 and 148 and the stiffening layer 142 thereon) is thereby defined in the donor wafer 120' between the weakened zone 123' and the bonding surface 121' of the donor wafer.

Appropriate implantation energies for a desired thickness of the transferred film/exfoliation layer 122 (e.g. implantation depth) can be calculated using a SRIM simulation tool. As the ion stopping powers of silicon and silicon nitride are different, the Si/ $Si_3N_4$ target has to be modeled in the SRIM input in order to calculate the appropriate implantation energy. Ion implantation techniques are well known in the art. One of skill in the art will understand how to determine an appropriate implantation energy for a desired implantation depth for any given implantation ion or species, donor wafer material, stiffening layer material, and any other material layers on the bonding surface 121' of the bonding wafer. For example, for $H^{2+}$ ions implanted at an energy of 60 keV through a 100 nm $Si_3N_4$ stiffening layer into the donor wafer 120' will form an exfoliation layer 122', including the $Si_3N_4$ stiffening layer, having a thickness of about 205 nm.

The bonding surface 121' of the donor wafer 120' is then cleaned to remove dust and contaminants in preparation for bonding. The donor wafer may be prepared for bonding by processing the donor wafer in an RCA solution and drying. The glass sheets 102' to be used as the support substrate are also cleaned to remove dust and contaminants in preparation for bonding. The glass sheets may be cleaned using a wet ammonia process to remove dust and contaminants and terminate the glass surface with hydroxyl groups for rendering the bonding surface of the glass highly hydrophilic for bonding to the bonding surface 121' of the donor wafer 120'. The glass sheets may then be rinsed in deionized water and dried. Such washing techniques are well understood in the art. One of skill in the art will understand how to formulate suitable washing solutions and procedures for the donor wafers and the glass support substrates.

Figure 10:
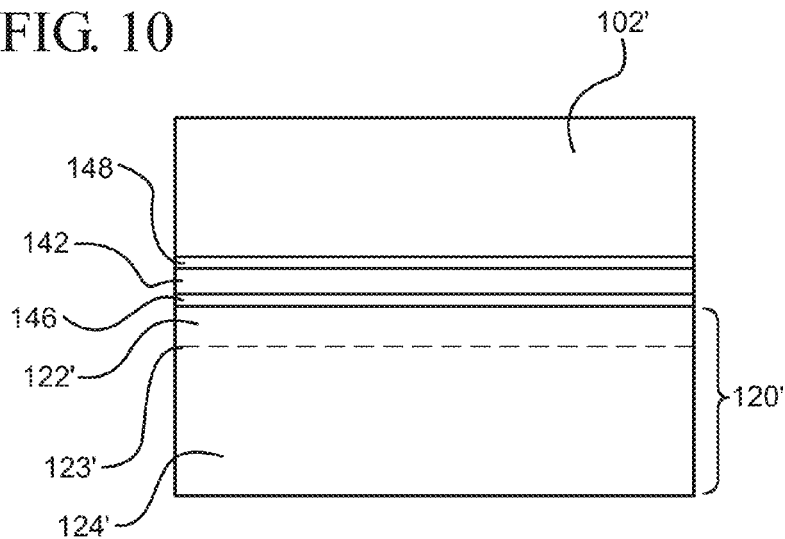
FIG. 10 is a diagrammatic side view of an implanted silicon donor wafer of FIG. 9 pre-bonded to a glass support or handle substrate layer in accordance with an embodiment of the present invention.

The bonding surface 121' of the exfoliation layer 122' is then pre-bonded to the glass support substrate 102' as shown in FIG. 10. The glass and the wafer, especially in the case of rectangular donor wafer or tile, may be pre-bonded by initially contacting them at one edge, thereby initiating a bonding wave at the one edge, and propagating the bonding wave across the donor wafer and support substrate to establish a void free pre-bond.

Figure 11:
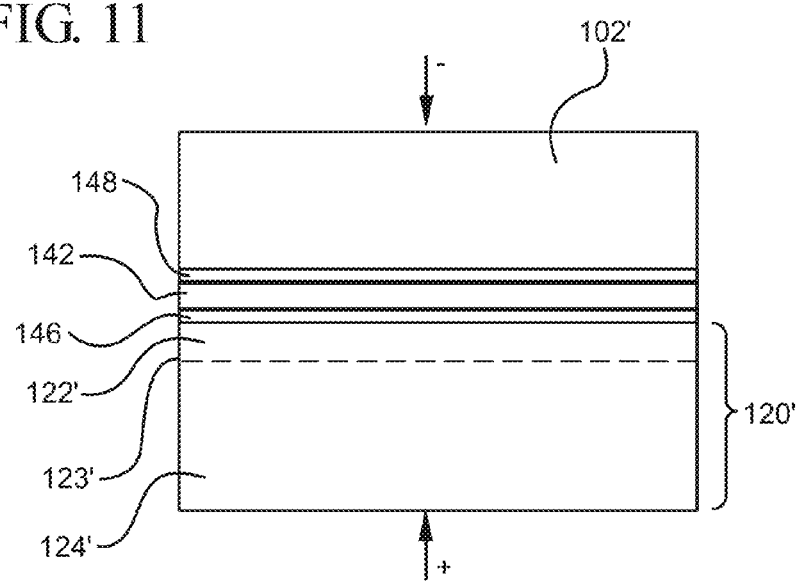
FIG. 11 is a diagrammatic side view of an implanted silicon donor wafer of FIG. 9 being bonded to a glass support or handle substrate layer in accordance with an embodiment of the present invention.
Figure 12:
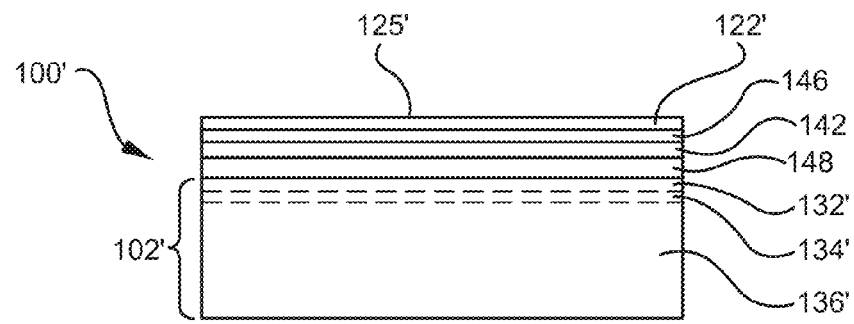
FIG. 12 is a diagrammatic side view of an SiOG structure in accordance with an embodiment of the present invention, with the remaining portion of the donor wafer separate and removed therefrom.

Next, the pre-bonded donor wafer is bonded to the glass substrate 102' and the exfoliation layer 122' is exfoliated and transferred to the glass substrate 102' as illustrated in FIG. 11 and previously described in relation to FIGS. 4-6. According to one embodiment disclosed herein, the pre-bonded glass-donor wafer assemblies are placed in a furnace/bonder for bonding and exfoliation. The glass-donor wafer assemblies may be placed horizontally in the furnace in order to prevent the remaining portions of the donor wafers from sliding on the newly transferred exfoliation layer and scratching the newly created silicon film 122' on the glass substrate substrates 102' following exfoliation. The glass-donor wafer assemblies may be arranged in the furnace with the silicon donor wafer 120' on the bottom, downward facing side of the glass support substrate 102'. With this arrangement, following exfoliation or cleaving of the exfoliation layer 122', the remaining portion 124' of the silicon wafer may be allowed to simply drop or be lowered down away from the newly exfoliated and transferred exfoliation layer 122'. Scratching of the newly created silicon film (the exfoliation layer) on the glass may thus be prevented. Alternatively, the glass-donor wafer assemblies may be placed horizontally in the furnace with the donor wafer on top of the glass substrate. In which case, the remaining portion 124' of the donor wafer must be carefully lifted from the glass substrate to avoid scratching the newly exfoliated silicon film 122' on the glass.

Once the pre-bonded glass-silicon assembly is loaded into the furnace, the furnace may be heated to 100-200° C. for 1 hour. This first heating step increases the bonding strength between the silicon and the glass thus. The temperature may then be ramped up to 600° C. to cause exfoliation. One skilled in the art can properly design furnace processing for exfoliation as it is described herein and as described, for example, in U.S. Pat. No. 7,176,528 and U.S. published patent application Nos. 2007/0246450 and 2007/0249139, the disclosures of each are hereby incorporated herein by reference.

Stiffening layers 142 formed of materials other than $Si_3N_4$ may be used to enable substantially canyon and pin hole free layer transfer. Particularly, silicon carbide films may be used for the stiffening layer as described herein. Other materials that may be used for the stiffening layer according to various embodiments of the present invention are listed in the following Table 1. In general, any material with a Young's modulus that is equal or higher than Young modulus of silicon, e.g. any material having a Young's modulus of about 125 GPa or greater, about 150 GPa or greater, or about 300 GPa or greater may be used as the stiffening layer. However, some materials having a high Young modulus are not suitable for use as a stiffening layer as described herein. Unsuitable materials are those that are not readily bondable to glass, for example, sapphire. Many materials that are initially non-bondable can, however, be rendered bondable and thereby made suitable for use as a stiffening layer as described herein. For example, $Si_3N_4$ can be rendered bondable by various techniques, including those described herein. Also, some materials, for example, copper, are not suitable due to potential contamination of the semiconductor exfoliation layer 122'.

TABLE 1

| Material | Young's modulus (GPa) |
| --- | --- |
| Diamond (C) | 1220 |
| Tungsten carbide (WC) | 450-650 |
| Silicon carbide (SiC) | 450 |
| Sapphire ($Al_2O_3$) along C-axis | 435 |
| Tungsten (W) | 400-410 |
| Titanium Nitride (TiN) | 600 |
| Molybdenum | 329 |
| Chromium | 279 |
| Nickel | 200 |
| Tantalum | 186 |

The glass support substrate 102' may be any suitable insulating glass material exhibiting any desirable characteristics, such as a glass, glass-ceramic, oxide glass, oxide glass-ceramic, or polymer material. As between oxide glasses and oxide glass-ceramics, the oxide glasses have the advantage of being simpler to manufacture, thus making glasses more widely available and less expensive than glass-ceramics. By way of example, a glass substrate may be formed from glass containing alkaline earth ions, such as substrates made of Corning Incorporated glass composition no. 1737, Corning Incorporated 2000™ glass, or Corning Incorporated Eagle XG™ glass. These Corning Incorporated fusion formed glasses have particular use in, for example, the production of liquid crystal displays. Moreover, the low surface roughness of these glasses that is required for fabrication of liquid crystal display backplanes on the glass is also advantageous for effective bonding as described herein. Eagle glass is also free from heavy metals and other impurities, such as arsenic, antimony, barium, that can adversely affect the silicon exfoliation/device layer. Being designed for the manufacture of flat panel displays with polysilicon thin film transistors, Eagle glass has a carefully adjusted coefficient of thermal expansion (CTE) that substantially matches the CTE of silicon, e.g. a Eagle glass has a CTE of 3.18×10-6 C-1 at 400° C. and silicon has a CTE of 3.2538×10-6 at 400° C. Eagle glass also has a relatively high strain point of 666° C., which is higher than the temperature needed to trigger exfoliation (typically around 500° C.). These two features, e.g. ability to survive exfoliation temperatures and CTE match with silicon, are main reasons for choosing Eagle glass for the silicon layer transfer and bonding. Advantageous glasses for the bonding processes disclosed herein will also have a surface roughness of about 0.5 nm RMS or lower, about 0.3 nm RMS or lower, or about 0.1 nm RMS or lower. Since exfoliation of the donor wafer typically happens around 500° C., the strain point of the glass should be greater than 500° C.

The glass substrates may be rectangular in shape and may be large enough to hold several donor wafers arrayed on the bonding surface of the glass. In which case, a single donor wafer-glass assembly as placed into the furnace/bonder for film transfer would include a plurality of donor wafers arrayed on the surface of a single glass sheet. The resulting SOG product would comprise a single glass sheet with a plurality of silicon films bonded thereto. The donor wafers may be round semiconductor wafers or they may be rectangular semiconductor wafers or tiles as previously described herein. As used herein, the term "donor tiles" is generally intended to indicate rectangular donor wafers and the term "donor wafers" is generally intended to indicate round donor wafers. However, unless it explicitly stated or clear that round or rectangular donor wafers are required for any particular embodiment described herein, the terms "donor wafers" and "donor tiles" should be understood to include either round or rectangular donor wafers.

Measurement of Surface Quality:

Due to the low surface area of the canyons, and in particular the pin holes, that occur in the as transferred exfoliation layer 122 in an ion implantation film transfer SOG fabrication process, typical average surface roughness and quality measurement are poor tools for measuring these types of defects. An as transferred semiconductor exfoliation layer as pictured in FIG. 13 containing severe, yet small in percentage of overall surface area, surface defects in the form of canyons and pin holes may actually have a better, e.g. smoother, average measured surface roughness than the as transferred semiconductor exfoliation layer as pictured in FIG. 14 that has substantially no severe canyon and pin hole surface defects. As a result, the as transferred layer in FIG. 13, which is unsuitable for fabrication of electronic devices, may have superior surface roughness and quality as determined by traditional measuring techniques than the as transferred layer of FIG. 14 that is suitable for fabrication of electronic devices. Thus, a new technique for measuring and characterizing the quality of as transferred semiconductor exfoliation layers is required that can identify good quality as transferred layers having an acceptably low level of canyons and pin holes.

Skewness calculations can used to characterize the surface morphology of the as transferred semiconductor layer in an ion implantation thin film transfer SOG fabrication process. Skewness is a statistical term used to describe asymmetry in relation to a normal distribution, or the degree to which a distribution departs from symmetry about its mean value. Skewness may be calculated using the following equation:

$$\text{Skewness} = \frac{1}{RMS^3} \frac{1}{n} \sum_{i=1}^{n} z_i^3$$

Where $z_i$ are the magnitude of the roughness height at the scanned data points, n is the number of data points in the scan, and RMS is the root mean square of the surface roughness magnitude.

Skewness may alternatively be calculated using the following equation:

$$\text{skewness} = \frac{\sum_{i=1}^{N}(Y_i - \overline{Y})^3}{(N-1)s^3}$$

where $Y_1, Y_2, \ldots, Y_N$ are univariate data, Y is the mean, s is the standard deviation, and N is the number of data points.

Figure 13:
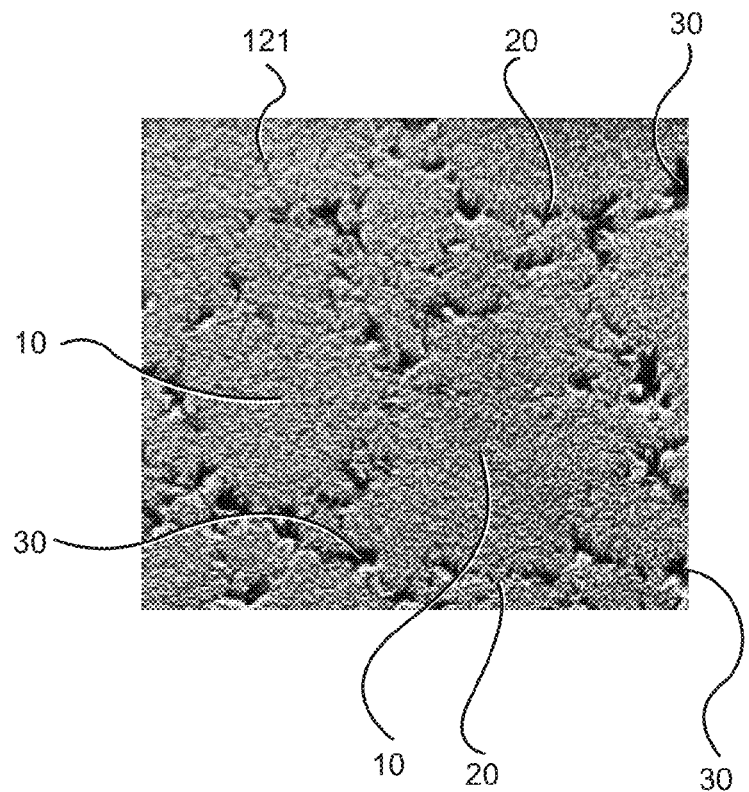
FIG. 13 is an SEM image of the surface of an as transferred silicon exfoliation layer produced using conventional ion implantation film transfer processes and conventional SiOG structures.
Figure 14:
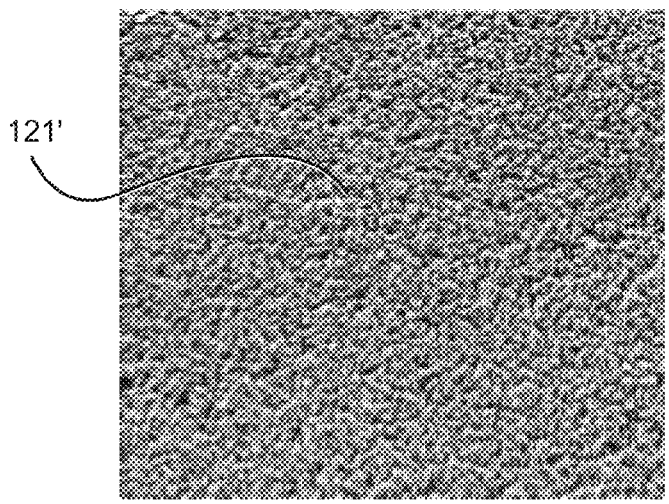
FIG. 14 is an SEM image of the surface of an as transferred silicon exfoliation layer produced using an ion implantation film transfer process and SiOG structure including a stiffening layer in accordance with an embodiment of the present invention.

The skewness of the roughness of the surface pictured in FIG. 14 is relatively high, due to the few but relatively very deep canyon and pin hole defects in the surface that create a skewed surface roughness distribution, e.g. a surface roughness distribution that is not symmetric about its mean value. In other words, if the rate of diversion of the surface from its mean value was plotted, rather than a symmetric bell curve, the outlying deep canyons and pin holes distort or skew the shape of the curve on the deep side of the mean value, making the curve un-symmetric. Whereas the skewness of the surface pictured in FIG. 13 is relatively low due to the lack of any deep canyon and pin hole defects in the surface that create a surface roughness distribution that is not skewed, e.g. its curve would be a symmetric bell curve. Skewness may be combined with RMS and/or Peak to valley metrics to identify satisfactory surface quality of the as transferred exfoliation layer. Skewness metrics will indicate surface roughness asymmetry (e.g. skew), while RMS and Peak to valley metrics will indicate the average surface roughness magnitude. A surface could have a very good skewness metric close to 0, while the RMS or peak to valley metric may be out of range making the substrate unsuitable for use without further finishing, and vice versa.

In order to provide an exfoliation layer on an SOG substrate that is suitable for fabrication of electronic devices, the surface of the exfoliation layer should of a skewness of about 0.6 or lower, about 0.4 or lower, or about 0.2 or lower. Acceptable surface roughness levels for the exfoliation layer are RMS of about 2 nm or lower, or about 1.5 nm or lower, or about 1 nm or lower. The surface measurements may be performed using a light interference profilometry Zygo tool on the surface of the as transferred exfoliation layer using 100× objective and 100×40 micron view field. Alternatively, the surface measurements may be performed on the as separated surface of the remaining portion of the donor wafer, where canyons and pin holes are seen as peaks. Measuring the as separated surface of the donor wafer may be easier to perform and provides indirect surface texture measurements of the surface of the as transferred exfoliation layer.

Oxygen Plasma Conversion of Stiffening Layer:

The PECVD deposition or growth of $SiO_2$ is well developed, and can be used for cost-efficient coating in mass production of oxide films. However, when growing a $SiO_2$ film on a Si3N4 stiffening layer as disclosed herein, it is difficult to grow uniform silicon dioxide films of the desired small thickness. As previously described herein, a very thin $SiO_2$ film, e.g. approximately 10 nm or less, is required for canyon-free SiOG transfer. Furthermore, $SiO_2$ has a Young modulus of 70 GPa and, as such, offers a much lower degree of stiffening than $Si_3N_4$ which has a Young's modulus of 150 GPa. Therefore, even a much thicker $SiO_2$ film as the stiffening layer (compared to a Si3N4 stiffening layer) will result in canyons and pin holes in the final silicon exfoliation layer of the SiOG structure. Also, attempts to deposit or grow a thin, approximately 10 nm thick $SiO_2$ films on a surface typically result in a discontinuous film having islands of $SiO_2$ separated by uncoated surface areas.

Other methods of depositing or growing very thin, e.g. approximately 10 nm thick, $SiO_2$ films are known in the art, but these are generally too expensive to be used for making SiOG cost effectively and are generally not compatible with bonding. Moreover, deposition processes typically increase surface roughness, while low roughness is one of the requirements for effective bonding. It has been found that a surface roughness under 0.5 nm RMS, or under 0.3 nm RMS for 20×20 μm² AFM scan is required for defect free bonding, whereas deposition processes typically produce films having surface roughness above 0.3 nm RMS for 20×20 μm² AFM scan. Thus, additional smoothing of a deposited film may be required to ensure defect free bonding. Chemical mechanical polishing can be used to improve the roughness. However, the nitride stiffening layer is a relatively hard film, and polishing of such a hard film is an expensive operation. Also, the polishing alone is not enough to make the nitride surface bondable. $SiO_2$ is bondable to glass, as its surface can be easily rendered hydrophilic. Deposition of the $SiO_2$ film over the silicon nitride stiffening layer is possible, but not preferable, because it results in an increase in surface roughness. Conversion of the surface of the Si3N4 stiffening layer into an oxide by thermal oxidation is possible, but not preferred either. The thermal oxidation of silicon nitride requires temperatures exceeding 1000° C. At these temperatures silicon rectangular tiles warp and thus become non-bondable.

According to an optional embodiment disclosed herein, oxygen plasma conversion of a near surface region of the silicon nitride stiffening layer into a $SiO_2$ layer may be employed to oxidize the bonding surface 121' of the donor wafer and make it hydrophilic and bondable to glass. Plasma oxidation methods are known, but to the knowledge of the applicants hereof have not, prior to this disclosure, been utilized to render a nitride surface bondable or to achieve the canyon-less silicon film transfer in an ion implantation film transfer process. Moreover, prior to this disclosure, it was not known in the art that by properly choosing plasma processing conditions, the surface roughness of a plasma oxidation converted film can be substantially improved as compared to the surface roughness of initial nitride film.

Figure 7:
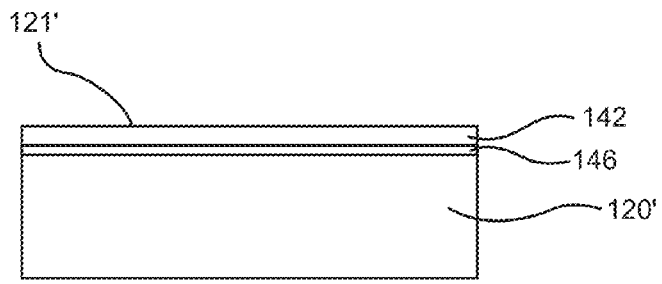
FIG. 7 is a diagrammatic side view of a silicon donor wafer with a stiffening layer deposited thereon in accordance with an embodiment of the present invention.

Oxygen plasma conversion of the near-surface region of the $Si_3N_4$ stiffening layer 142 into a $SiO_2$ oxide layer prior to pre-bonding may be employed as a method to make the bonding surface 121' of a $Si_3N_4$ stiffening or other barrier layer 142 on a donor wafer 120' hydrophilic and readily bondable to silicon or glass substrates 102'. A process for the oxygen plasma conversion of the near-surface region of the $Si_3N_4$ stiffening layer 142 may consist of the following steps. First, the $Si_3N_4$ stiffening layer 124 is deposited onto the bonding surface 121' of a donor silicon wafer 120' as illustrated in FIG. 7. The donor wafer is then implanted with ions as previously described in relation to FIG. 9 to form a weakened layer 123' in the donor wafer 120' and define the exfoliation layer 122'. The implanted donor wafer 120' is then placed in a plasma chamber and processed with oxygen plasma so as to simultaneously (1) convert a portion of the surface of the $Si_3N_4$ stiffening layer 142 into a $SiO_2$ layer and (2) smoothen the surface of the $Si_3N_4$ stiffening layer. Both the oxidation and smoothing of the $Si_3N_4$ film increase the bondability of the $Si_3N_4$ coated bonding surface 121' silicon donor wafer 120'.

The oxygen plasma conversion process conditions are chosen such that a 2 nm to about 20 nm thick, or about 5 nm to about 10 nm thick, or about a 5 nm thick $SiO_2$ film is formed in the near surface portion of $Si_3N_4$ stiffening layer 142 and the roughness of the surface of the stiffening layer is improved. The bonding surface 121' of the donor wafer is thus simultaneously smoothened and oxidized, rendering the surface hydrophilic and smooth enough for bonding to the glass support substrate 102'. The donor wafer may be prepared for bonding by processing in RCA solution and drying. A reciprocal glass support or handle substrate 102' is also rendered hydrophilic as previously described herein. The process is completed by pre-bonding the silicon donor and glass support substrates and bonding and separating (exfoliating) the exfoliation layer from the remaining portion of the silicon donor wafer as previously described herein in relation to FIGS. 10 and 11.

Optionally, double plasma conversion of the $Si_3N_4$ stiffening layer 142 on the silicon donor substrate 120' may be performed to ensure complete cleaning of organic contamination attained during the ion implantation step from the surface of the donor wafer, and to further improve the roughness of the bonding surface 121'. The double plasma conversion may be performed in 3 steps: (1) a first oxygen plasma conversion of the surface of the $Si_3N_4$ stiffening layer 142 on the implanted silicon donor wafer, (2) wet stripping of the oxide layer formed by the first plasma conversion step, and (3) a second oxygen plasma conversion of the surface of the $Si_3N_4$ stiffening layer 142 on the implanted silicon donor wafer. The first plasma conversion step forms a sacrificial silicon dioxide film with carbon contamination from organics deposited during ion implantation. The wet stripping step removes the carbon contamination and reveals a clean silicon nitride surface. The second plasma conversion step forms a pure oxide film that is thin enough to retain high surface stiffness of the $Si_3N_4$ stiffening layer 142, while being smooth enough to enable hydrophilic bonding to the glass substrate.

Figure 15:
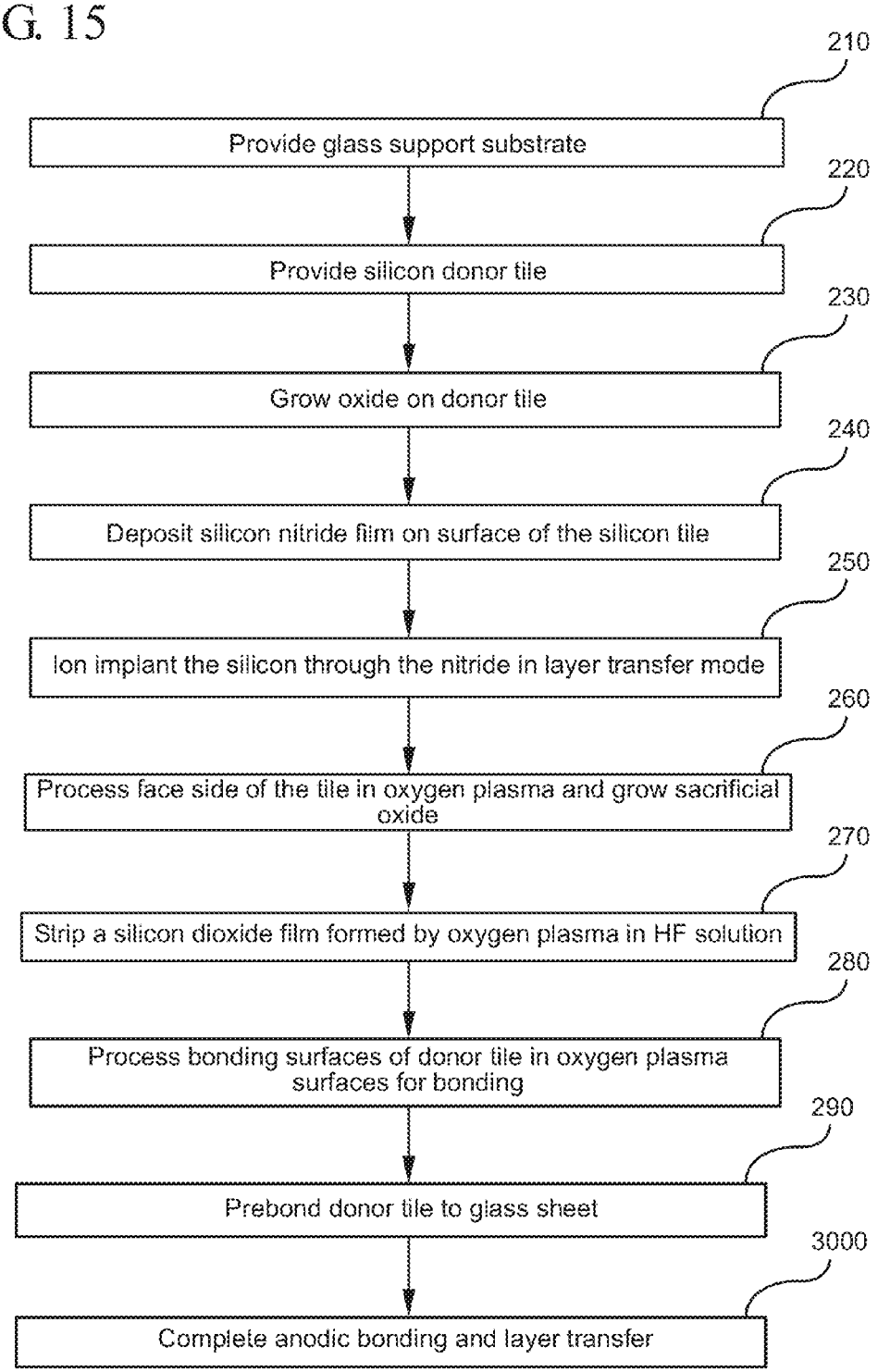
FIG. 15 is a flowchart illustrating an oxygen plasma conversion process for oxidizing the surface of the stiffening layer according to an embodiment of the present invention.

An exemplary process according one embodiment for oxygen plasma conversion of the near-surface region of $Si_3N_4$ stiffening layer on the donor wafer will now be described in more detail with reference to FIG. 15.

In 210, as previously described herein, Gen 2 size (370×470×0 5 mm) Corning Eagle XG™ glass may be chosen as the insulating support substrate for the fabrication of SiOG. Gen 2 size glass sheets enable simultaneous fabrication of several 3 inch mobile displays in a cost effective manner on a single glass support substrate.

In Step 220, as previously described herein, according to one embodiment hereof, regular round 300 mm prime grade silicon wafers may be chosen for use as donor wafers 120' or substrates for the fabrication of SiOG structures or substrates. 180×230 mm rectangular donor wafers or donor tiles may be cut from the initially round wafers and the donor tile edges may be processed in order to profile the edges and obtain a round or chamfered profile similar to SEMI standard edge profile. Other required machining steps, such as corner chamfering or rounding and surface polishing, may also be performed.

In Step 230, as previously described herein, an $SiO_2$ (or other oxide) layer 146 (See FIG. 7) is grown or deposited on the bonding surface 121' of the donor tile 120'. The surface of the silicon donor tile may be oxidized using thermal, plasma, or chemical oxidation processes before deposition of the $Si_3N_4$ stiffening layer. Alternatively, as previously described herein, the native oxide film may be intentionally left on the surface of the donor tile, or steps may be taken to remove the native oxide film or prevent or minimize the formation of a native oxide film on the donor tile.

In Step 240, as previously described herein in relation to FIG. 7, a $Si_3N_4$ stiffening layer or film 142 is deposited onto the silicon donor tile 120' over the native or deposited oxide film 146.

In Step 250, as previously described herein in relation to FIG. 9, the donor tiles 120' with the deposited $Si_3N_4$ stiffening layer 142 are ion implanted to form the weakened region 123' within the silicon donor tiles and define the silicon exfoliation layer 122'. As previously described, a low surface roughness is required for subsequent bonding to the glass. The surface roughness of the bonding surface 121' of the deposited $Si_3N_4$ stiffening layer 142 was analyzed by scanning with an atomic force microscopy (AFM) and with an optical technique using Zygo tool. Both methods demonstrated that the surface roughness was in the range from about 0.3 nm to about 1.0 nm RMS for 20×20μm² AFM. This roughness is known to be good enough for bonding. However, for substrates with such roughness, the bonded assembly typically has defects in the bonding interface (voids). It has been found that a surface roughness under 0.3 nm RMS for 20×20μm² AFM is required for defect free bonding.

In Step 260, similar to the step as previously described in relation to FIG. 8, the bonding surface 121' of the $Si_3N_4$ stiffening layer142 is treated with an oxygen plasma conversion process to convert the near surface region of the $Si_3N_4$ stiffening layer into a $SiO_2$ oxide bonding layer 148. The resulting layers on the silicon donor tiles now include a first $SiO_2$ (oxide) layer 146 on the silicon donor tile, a $Si_3N_4$ stiffening layer 142 on the first $SiO_2$ (oxide) layer, and a second $SiO_2$ (oxide) smoothing and bonding layer 148 on the $Si_3N_4$ stiffening layer, e.g. an oxide-nitride-oxide or ONO (146-142-148) layered structure on donor tiles.

In order to convert the bonding surface 121' of the $Si_3N_4$ stiffening layer 142 (which may have a surface roughness form 0.3 nm to 1.0 nm RMS for 20×20μm² AFM) into an $SiO_2$ bonding layer 148, the donor tiles 120' may be processed in a low frequency, 30 kHz Technics plasma tool. By way of example, the processing conditions may be: incoming gas of oxygen, oxygen flow of 2 sccm, pressure in the chamber of 30 mTorr, plasma power of 700 W, and process time of 30 minutes. This results in a 15 nm thick $SiO_2$ bonding layer 148 in the near surface region of the $Si_3N_4$ stiffening layer 142 with a surface roughness slightly below 0.3 nm RMS. A very thin $SiO_2$ film having a thickness in the range of about 2 nm to about 20 nm, or about 7 nm to about 10 nm in thickness may be easily produced on the $Si_3N_4$ stiffening layer, such that the stiffening effect of the $Si_3N_4$ stiffening layer is not compromised.

The $SiO_2$ bonding layer 148 produced in Step 260 is near stoichiometric and has a low nitrogen content (under Secondary Ion Mass Spectrometry (SIMS) detection limit). SIMS analysis was performed on donor tiles with $Si_3N_4$ stiffening layers with $SiO_2$ films produced according to Steps 210 through 260. No nitrogen was detected near the surface of the $SiO_2$ bonding layer 148. The complete removal of nitrogen in the plasma converted region ensures hydrophilicity and proper bondability of the new bonding surface 121' to the glass support substrate 102'.

The smoothing effect of the oxygen plasma conversion treatment was confirmed by the Applicants using SIMS analysis of experimental samples. SIMS analysis showed that the bonding surface 121' of the $SiO_2$ bonding layer 148 is smoother after a relatively long plasma processing time approaching 50 minutes than after a relatively short plasma processing time of just a few minutes. With relatively long plasma processing times greater than 50 minutes, however, the roughening due to sputtering becomes significant. Effective smoothing for bondability may be achieved with plasma processing times in a range from about 5 minutes to about 50 minutes or from about 10 minutes to about 25 minutes.

Oxygen plasma conversion of the $Si_3N_4$ surface into $SiO_2$ is not limited to low frequency plasma tools. RF, microwave, and other types of plasma equipment and processes can be employed as well. Through routine experimentation, one skilled in the art can select proper plasma equipment and conditions, such as plasma power, processing time, oxygen flow, and pressure in the chamber, required to convert the desired thicknesses of the $Si_3N_4$ or other stiffening layer into an oxide by oxygen plasma conversion as described herein.

By proceeding now to Step 290, the donor tiles 120' may now be used to bond and transfer the exfoliation layer 122', with the $Si_3N_4$ stiffening layer 142 and $SiO_2$ layer 148 thereon, to a glass or silicon support substrate 102' as previously described herein in relation to FIGS. 10 and 11. However, when the silicon donor tiles with the $Si_3N_4$ stiffening layer is ion implanted in the previous ion implantation Step 250, the bonding surface 121' of the $Si_3N_4$ stiffening layer is contaminated with organics that are adsorbed from the ion implant chamber. This contamination is hard to remove by wet chemical means, but can be easily removed if a sacrificial oxide film is formed underneath the contaminants and the sacrificial oxide film is then removed. The oxide layer formed by the oxygen plasma conversion of Step 260 can be used as such a sacrificial oxide layer. If it is desirable to remove these contaminants prior to bonding the donor tiles to a support substrate, then the following Steps 270 and 280 may optionally be performed.

In Step 270, the sacrificial $SiO_2$ layer 148 formed by the first oxygen plasma conversion processing step is stripped by bathing the donor tiles in an HF or other suitable solution. The organics and other contaminants are thus effectively removed from the surface of the $Si_3N_4$ stiffening layer 142 with the sacrificial $SiO_2$ layer.

In Step 280, a second oxygen plasma conversion step is performed to 1) smoothen the now organic contaminant free bonding surface 121' of the $Si_3N_4$ stiffening layer 142 on the donor tiles 120' and 2) oxidize the bonding surface 121' of the $Si_3N_4$ stiffening layer 142 to make it hydrophilic and bondable to the glass support substrate 102'. The resulting structure layers on the silicon donor tiles once again now include a first $SiO_2$ (oxide) layer 146 on the silicon donor tile, a $Si_3N_4$ stiffening layer 1142 on the first $SiO_2$ (oxide) layer, and a second $SiO_2$ (oxide) smoothing and bonding layer 148 on the $Si_3N_4$ stiffening layer, e.g. an oxide-nitride-oxide or ONO layered structure (or NO structure). It was found that the surface roughness of the $SiO_2$ bonding layer 148 after the conversion-strip-conversion cycle with 1 minute plasma process time for the first conversion step and 5 minutes for the second conversion step is about 0.2 nm RMS. This cleaned, highly smooth, hydrophilic surface has excellent bondability and generates high yield at the subsequent bonding step. A very thin $SiO_2$ film having a thickness of 10 nm or less, 7 nm or less, or in the range of 2 to 20 nm, may be easily produced on the $Si_3N_4$ stiffening layer, such that the stiffening effect of $Si_3N_4$ stiffening layer is not compromised while still smoothing the bonding surface. Plasma processing times may be in a range of from about 1 minute to about 20 minutes, from about 5 minutes to about 20 minutes, or from about 10 minutes to about 20 minutes.

Three purposes, namely, efficient cleaning, surface smoothing, and creating a hydrophilic, bondable surface, are simultaneously achieved with the double plasma conversion process, e.g. plasma conversion-strip-plasma conversion ONO generating cycle (or NO generating cycle if no oxide layer is formed on the donor tiles or wafers in step 230). The double plasma conversion process is particularly useful for smoothing the bonding surface of the $Si_3N_4$ stiffening layer 142. The plasma-strip-plasma cycle is more efficient in roughness improvement, than, say, doubling the oxygen plasma processing time performed in a single plasma conversion step. The surface roughness improvement generates increased yields in the bonding step.

In Step 290, as previously described herein in relation to FIG. 10, the glass substrates 102' and donor tiles 120'are pre-bonded. First, the glass substrate and donor tiles area cleaned of contamination and rendered hydrophilic in preparation for bonding. The glass substrates/sheets may be washed in an ammonia bath and dried. The ONO bonding surface 121' on the donor tiles may be cleaned and rendered hydrophilic in an SC1 wash and dried. Prepared donor tiles 120' with the plasma converted $Si_3N_4$ stiffening layer 142 are placed on a glass support substrate 102', with the $Si_3N_4$ stiffening layer and $SiO_2$ bonding film located between the glass and the donor tiles, thereby pre-bonding the donor tiles to the glass support substrate. Thus, pre-bonded intermediate donor tile-glass assemblies are formed.

In Step 210, as previously described herein in relation to FIG. 11, the exfoliation layers 122' (with stiffening 142 and bonding layers 146 & 148 thereon) are bonded to the glass substrate 102' and separated (exfoliated) from the remaining portions 124' of semiconductor donor tiles. First, the donor tile-glass assemblies are placed in a furnace/bonder. Then the furnace is heated, and pressure and optionally voltage are applied to cause bonding and separation (exfoliation) of the exfoliation layers via an ion implantation thermal or anodic bonding layer transfer process. The exfoliation layers 122' with the ONO structure is thus transferred from the donor tiles and bonded to the glass substrate 102'. If desired, voltage may be applied as previously described to anodically bond the exfoliation layers to the glass substrate. If necessary, the exfoliated surface 125' of the as transferred exfoliation layer 125' may be further processed by annealing, washing or polishing, as previously described herein.

The processes and SOG structures described herein provide a higher yield bonding step as compared to processes that use deposited films (deposited either on silicon or on glass). The processes and SOG structures described herein also ensure high yield of transistors fabrication processes, because of the provision of a superior barrier layer compared the anodically generated in-situ or deposited $SiO_2$ barrier layer and ion depleted glass layer.

Various embodiments will be further clarified by the following examples.

EXPERIMENT 1

Efficacy of the $Si_3N_4$ stiffening layer as a barrier layer in SiOG was tested. In a first test the SiOG structure was annealed at 600° C. for 24 hour and contamination in the silicon exfoliation layer was measured with Secondary Ion Mass Spectrometry (SIMS) analysis. SIMS analysis found no contamination. In the second test, an electric voltage 100 V was applied between top and bottom surfaces of the SiOG, and the sample was also heated to 600° C. Again, SIMS was used to detect contamination in the silicon film. Contamination of the Si exfoliation layer was found to be below the SIMS detection limit. A 5-layer SiOG structure made per '528 patent previously referred to herein might pass the first test, but would not pass the second test.

EXPERIMENT 2

A $Si_3N_4$ film was deposited on silicon donor tiles with a standard LPCVD tool using argon-diluted silane and ammonia mixture, 40 sccm total gas flow rate, 3:1 ratio of silane and ammonia, at 800° C. and 1 mTorr pressure in the chamber. This resulted in a deposition rate of about 2 nm/minute and deposition of a 100 nm thick $Si_3N_4$ stiffening layer on the donor tiles.

An attempt to bond the $Si_3N_4$ coated silicon donor tile directly to an Eagle glass support substrate or sheets was made. The donor tiles were prepared for the bonding by processing the donor tiles in RCA solution and drying. The glass sheets were prepared by processing the glass sheets in an ammonia bath and drying. The hydrophilicity of the nitride and glass surfaces was measured using a Kruss DSA20 instrument to measure the wetting angle of the surfaces. The glass surface was found to be highly hydrophilic with a wetting angle below 2°. The surface of the $Si_3N_4$ stiffening layer was found to have a mild hydrophilicity with a wetting angle of 35°. The glass and the tile were pre-bonded by initially contacting them at one edge to initiate a bonding wave at one edge and propagating the bonding wave across the glass and tile substrates. The pre-bonded intermediate assembly was heated to 600° C. This attempt at directly bonding the $Si_3N_4$ coated silicon donor tile directly to an Eagle glass support substrate failed. There were many voids on the bonding interface.

This experiment confirms that $Si_3N_4$ is not directly bondable to glass.

EXPERIMENT 3

A $Si_3N_4$ stiffening layer having a thickness of 100 nm, which is suitable to ensure effective stiffening yet thin enough to allow standard energy ion implantation of the donor wafer at 60 keV, was deposited on donor wafers. The thickness of the stiffening layer should not exceed the thickness of the exfoliation layer. Some trial samples were also made with $Si_3N_4$ stiffening layers having a thickness below 100 nm. SiOG formed with a $Si_3N_4$ stiffening layer having a thickness in the range between 50 nm and 100 nm has shown some canyons. SiOG substrates formed with a $Si_3N_4$ stiffening layer having a thickness below 50 nm has exhibited a mesas-canyon-pin hole pattern on the surface of the as transferred exfoliation layer similar to SiOG made without any stiffening layer. SiOG samples with a $Si_3N_4$ stiffening layer having a thickness of 250 nm were also made. These samples were implanted at energy of H2+ species 125 keV. At 125 keV, such that a film stack consisting of the 250 nm $Si_3N_4$ and 350 nm of silicon exfoliation layer was transferred. These samples showed no canyons or pin holes.

Experiment 3 reveals that, in order to have a sufficient stiffening effect, the thickness of the stiffening film may be in a range about 100 nm or greater, or about 250 nm or greater.

EXPERIMENT 4

Standard prime grade silicon wafers that were 300 mm size, <100> orientation, p-type, boron doped, 8 to 13 Ohm-cm resistivity, and 775 micron thick were selected as donor wafers. A $Si_3N_4$ layer was deposited on the donor wafers using the following LPCVD technique. The wafers were loaded into LPCVD reactor without stripping of a native oxide film from the wafers. The LPCVD process was performed at 800° C. The process temperature, time, and pressure in the chamber and reactive gases were chosen to obtain 100 nm thick stoichiometric $Si_3N_4$ layer on the bonding surface of the donor wafer. The thickness uniformity of the deposited $Si_3N_4$ layer was measured with ellipsometry technique and it was found to be 100 nm +/−1% of thickness. Roughness of the surface of the deposited $Si_3N_4$ layer was measured using AFM and it was found to be 0.2 nm RMS in roughness, which is sufficient for further wafer bonding processing. Stresses in the deposited $Si_3N_4$ layer were measured using Tencor FLX tool and were found to be 700 MPa tensile stress. The $Si_3N_4$ layer was observed to be continuous without flakes. Trial depositions of thicker $Si_3N_4$ layer were performed to estimate the stability of the $Si_3N_4$ layer at various thicknesses. It was found that the $Si_3N_4$ layer started flaking when the layer thickness exceeded 350 nm.

Experiment 4 demonstrates that Si3N4 stiffening layers up to 350 nm thick can be use in the previously described SiOG fabrication process of without risk of lowering the process yield.

The silicon donor wafers with $Si_3N_4$ stiffening layers deposited thereon were then implanted with hydrogen. The hydrogen implantation dose and energy was 5.5E16 cm-2 and 30 keV respectively. This implantation condition causes exfoliation at a depth of about 300 nm under the surface of the donor wafer with the $Si_3N_4$ stiffening layer deposited thereon, such that a stack consisting of 100 nm of $Si_3N_4$ and 200 nm of silicon exfoliation layer of crystalline silicon is transferred to the glass substrate.

Gen2 size sheets of standard display glass, e.g. Corning Eagle XG glass that has a low roughness suitable for bonding, having a thickness of 0 5 mm were selected as the glass support substrate. The glass was cleaned with a wet ammonia process. The glass sheets were then rinsed in deionized water and dried. Hydrophilicity of the prepared glass surface was tested with contact wetting angle measurements. The wetting angle was found to be below the lowest angle that is possible to measure with the setup −2°. It indicates good bondability of the glass surface.

The silicon wafer and glass were then pre-bonded. The pre-bonded glass-silicon assembly was loaded into a furnace for bonding and exfoliation. The glass-donor wafer assemblies were placed horizontally in the furnace with the donor wafer on the bottom side facing down. The assembly was first heated to 100-200° C. for 1 hour. This step increases the bonding strength between silicon and glass thus eventually improving layer transfer yield. The temperature was then ramped up to 600° C. to cause the exfoliation.

The fabricated SiOG substrates were analyzed using atomic force microscopy, scanning electron microscopy, optical microscopy in transmission Nomarski mode, and with confocal optical microscopy. The resulting as transferred exfoliation layer produced using a $Si_3N_4$ stiffening demonstrated significantly improved as transferred exfoliation layer/film surface morphology and crystalline quality compared to when using just a $SiO_2$ barrier layer. Also, a transmission electron microscope (TEM) cross section analysis of SiOG film with $Si_3N_4$ stiffening layer showed no visible crystal defects in the film. Scanning electron microscope (SEM) surface analysis of SiOG as transferred films also revealed superior surface morphology for SiOG/Si$_3$N$_4$ SiOG substrates (see FIG. 13) and relatively poor surface quality with visible canyon type damages surface damages which penetrates Si exfoliation layer/film depth (see FIG. 14). Secondary ion mass spectroscopy (SIMS) on the SiOG so produced using an Si$_3$N$_4$ stiffening layer revealed a high purity Si thin film.

Experiment 4 demonstrates that Si$_3$N$_4$ forms an effective barrier layer for the prevention ionic element migrations such as sodium and alkalis from glass into the Si thin film, as well as a superior stiffening layer.

EXPERIMENT 5

An 8" glass support substrate was cut from a gen 2 glass sheet. A Si$_3$N$_4$ stiffening layer and a SiO$_2$ bonding layer were deposited on the 8" glass support substrate using a standard PECVD tool. The PECVD process was performed at a temperature of 480° C. and 350° C. for the deposition of the silicon nitride and silicon oxide layers respectively. A thickness of 50 nm was targeted for both the silicon nitride and silicon oxide layers. In order to outgas by products from the PECVD process, the glass support substrates were then thermally treated in a furnace at temperature of 600° C. for 2 hours. An AFM measurement was performed on similar bi-layers deposited on Si wafers, rather than on glass support substrates, was performed. The surfaces exhibited a RMS of 0.32 nm for a 20×20 µm$^2$ scanning and 0.25 for a 10×10 µm$^2$ scanning.

A standard prime grade 8" silicon donor wafer was cleaned using a standard RCA cleaning. The donor wafer was implanted with He at an energy of 47 keV and a dose of 1.1 e16 at/cm$^2$. The donor wafer was then implanted with H+ at an energy of 30 keV and a dose of 1e16 at/cm$^2$.

Both the glass wafer and the implanted silicon wafer were cleaned using a standard RCA and then pre-bonded. The pre-bonded glass-silicon assembly was loaded into a furnace for exfoliation. The assembly was heated for 1 hour at 200° C. followed by a temperature ramp up to 550° C. to bond the exfoliation layer to the support substrate and cause exfoliation.

The remaining part of the silicon donor wafer after exfoliation was then analyzed using an optical profilometry measurement technique. This measurement was carried out on the surface of the remaining portion of the silicon donor wafer, not on the silicon exfoliation layer, because the Zygo tool used for this measurement does not accept transparent glass substrates. This measurement is believed to be relevant to the roughness of the surface the exfoliated layer, which is believed to be a negative (inverse mating) surface of the surface of the remaining portion of the Si donor wafer. This measurement on the Zygo tool was made using a 100× objective providing a roughness scan of 140×100 µm$^2$ with a lateral resolution of 0.6 µm after post measurement digital processing.

Figure 16:
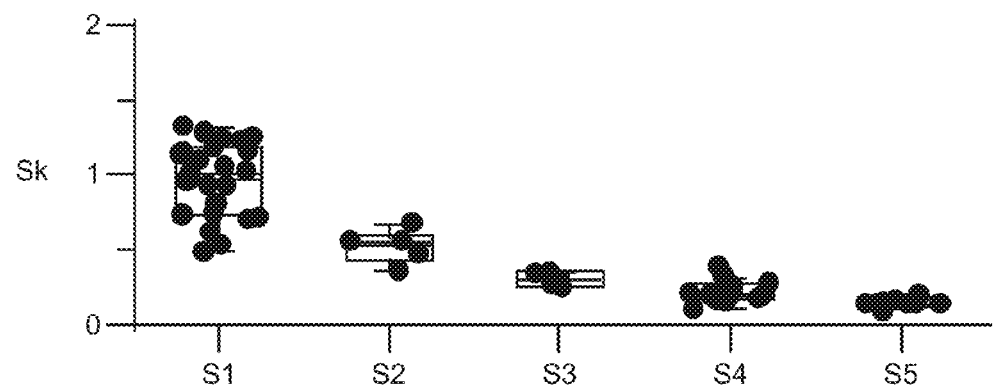
FIG. 16 is a plot showing the surface roughness skewness level of five types of experimental samples in accordance with Experiment 5 as described hereinafter.
Figure 17:
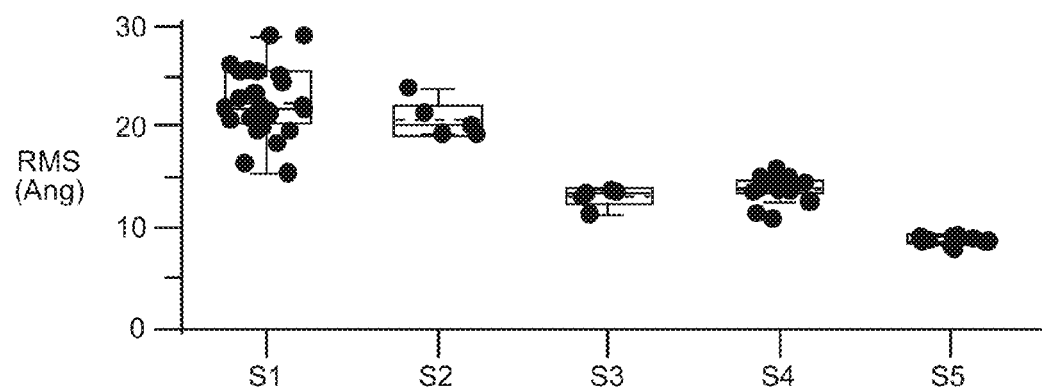
FIG. 17 is a plot showing the RMS surface roughness of the five types of experimental samples in Experiment 5.
Figure 18:
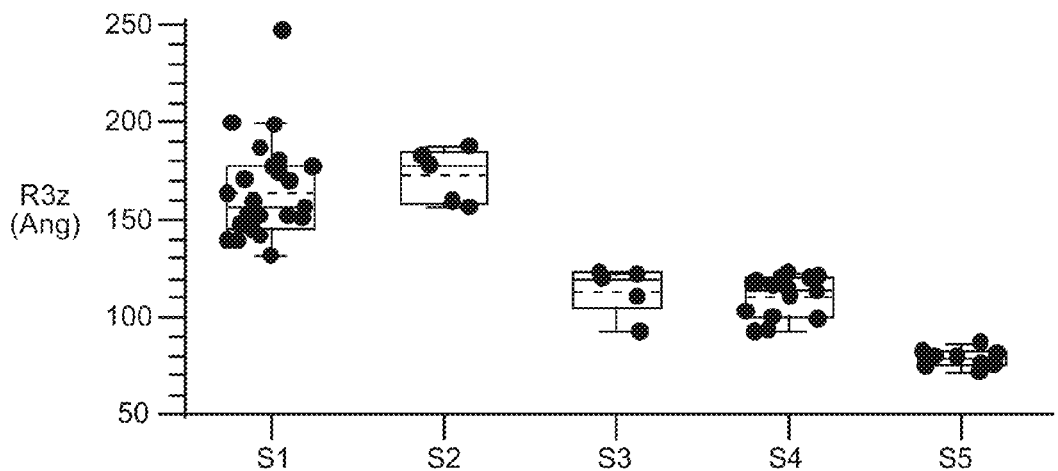
FIG. 18 is a plot showing the peak-to-valley (R3z) surface roughness of the five types of experimental samples in Experiment 5.

FIGS. 16 through 18 show the different statistical parameters extracted from the Zygo tool roughness scans for different configurations of the SiOG product. FIG. 16 shows the measured skewness SK, FIG. 17 show the measured RMS in Angstroms, and FIG. 18 shows the measured R3z in Angstroms, which is the peak to valley of the roughness image from which the 3 higher and 3 lower points have been removed in order to avoid any impact of measurement artifacts. These 3 parameters are shown respectively for different types of experimental samples, including samples made in accordance with this experiment 5. The first experimental samples S1, are reference samples prepared in accordance with a prior art process using hydrogen only for implantation and no stiffening layer. The second experimental samples S2, were prepared with an ONO tri-layer structure according the present disclosure deposited on the silicon donor wafer and hydrogen was employed for implantation. For this particular case, the ONO stack thicknesses are 5 nm, 72 nm and 220 nm for the pad oxide, the silicon nitride and the cap oxide layers respectively. The 3$^{rd}$ experimental samples S3 were prepared with no stiffening layer and with Helium and Hydrogen co-implantation. The 4$^{th}$ experimental samples S4 were prepared in accordance with the present disclosure with a silicon nitride stiffening layer and a silicon oxide bonding layer deposited on the donor wafer, such that a NO bi-layer structure was deposited on the donor silicon wafer, and with Helium and Hydrogen co-implantation. In this case, both the silicon nitride and silicon oxide layers are 50 nm thick. Finally the 5$^{th}$ experimental samples S5 were prepared in accordance with the preceding description of example 5, with a silicon nitride stiffening layer and a silicon oxide bonding layer deposited on the glass support substrate, such that a NO (Si$_3$N$_4$—SiO$_2$) bi-layer structure was deposited on the glass support substrate, and with Helium and Hydrogen co-implantation.

Viewing plots in FIGS. 10 through 19, it can be seen the Experiment 5 demonstrates that a significant improvement is observed for the experimental samples S5 compared to the reference samples S1. At the same time, it demonstrates that the use of ONO (SiO$_2$—Si$_3$N$_4$—SiO$_2$) tri-layer structures deposited on Si donor wafers with Hydrogen implantation in samples S2 improves the skewness level (e.g. reduces skewness) of the surface roughness (See FIG. 17), while both the RMS (See FIGS. 18) and R3z (See FIG. 19) of the samples are relatively unchanged when compared with the reference samples S1. Co-implantation of Hydrogen and Helium in experimental samples S3, S4 and S5 was demonstrated to benefit all 3 parameters (See FIGS. 17-19). Finally, when a silicon nitride stiffening layer and a silicon oxide bonding layer was formed on the Si donor wafer in samples S4 or on the glass support wafer in samples S5, an additional improvement in reduced surface roughness was demonstrated (See FIGS. 18 & 19). In particular, samples S4 made with He/Hy co-implantation and NO bi-layers on the Si donor wafer demonstrated a better (lower) skewness level (See FIG. 17) than the He/Hy co-implantation samples S3, while samples S5 made with He/Hy co-implantation and NO bi-layers on the glass support substrate demonstrated improvement in all the parameters with respect to the He/Hy co-implantation samples S3.

Advantages of using a stiffening layer in an SOG structure and processes for manufacturing the same as disclosed herein include:
Improved semiconductor exfoliation layer surface morphology,
Improved semiconductor exfoliation layer surface smoothness,
Reduced mechanical polishing costs,
Superior barrier layer that enables production of a semiconductor exfoliation layer on glass that retains a high level of purity for fabrication of SOG based electronic devices with superior electrical performance and lifetime.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A semiconductor on glass structure, comprising:
   a glass substrate having a first Young's modulus;
   a stiffening layer having a second Young's modulus;
   an oxide layer on the stiffening layer; and
   a semiconductor layer on the oxide layer, the semiconductor layer having a predetermined surface roughness.

2. The semiconductor on glass structure of claim 1 wherein the stiffening layer has a Young's modulus of about 125 GPa or higher.

3. The semiconductor on glass structure of claim 2 wherein the stiffening layer has a Young's modulus of about 150 GPa or higher.

4. The semiconductor on glass structure of claim 3 wherein the stiffening layer has a Young's modulus of about 200 GPa or higher.

5. The semiconductor on glass sturcture of claim 1 wherein the semiconductor layer has a surface roughness with a skewness level of about 0.6 or lower.

6. The semiconductor on glass structure of claim 1 wherein an exposed surface of the semiconductor layer has a surface roughness with a skewness level of about 0.4 or lower.

7. The semiconductor on glass structure of claim 1 wherein the stiffening layer has a thickness about 50 nm or greater.

8. The semiconductor on glass structure of claim 4 wherein the stiffening layer is formed of Silicon Nitride.

9. The semiconductor on glass structure of claim 1 wherein the oxide layer is formed of Silicon oxide.

10. The semicondutor on glass structure of claim 9 wherein the oxide layer has a thickness of about 2 nm to about 150 nm.

11. The semiconductor on glass structure of claim 1 wherein the glass substrate further comprises:
   (i) a first glass layer adjacent to the stiffening layer in which substantially no modifier positive ions are present, and
   (ii) a second glass layer adjacent the first glass layer having an enhanced concentration of modifier positive ions.

12. The semiconductor on glass structure of claim 1 wherein the stiffening layer has a thickness of about 100 nm or greater.

13. The semiconductor on glass structure of claim 12 wherein the stiffening layer has a thickness of about 250 nm or greater.

14. The semiconductor on glass structure of claim 13 wherein the stiffening layer has a thickness of about 350 nm or greater.

15. The semiconductor on glass structure of claim 1 wherein the oxide layer has a thickness of about 5 nm to about 150 nm.

16. The semiconductor on glass structure of claim 1 wherein the oxide layer has a thickness of about 2 nm to about 20 nm.

17. The semiconductor on glass structure of claim 16 wherein the oxide layer has a thickness of about 5 nm to about 10 nm.

18. The semiconductor on glass structure of claim 12 wherein the surface of the stiffening layer is hydrophilic.

19. The semiconductor on glass structure of claim 1 wherein the semiconductor layer is formed from of silicon (Si), germanium-doped silicon (SiGe), silicon carbide (SiC), germanium (Ge), gallium arsenide (GaAs), GaP, or InP.

* * * * *